US010110995B2

(12) United States Patent
Klippel

(10) Patent No.: US 10,110,995 B2
(45) Date of Patent: Oct. 23, 2018

(54) METHOD AND ARRANGEMENT FOR CONTROLLING AN ELECTRO-ACOUSTICAL TRANSDUCER

(71) Applicant: Wolfgang Klippel, Dresden (DE)

(72) Inventor: Wolfgang Klippel, Dresden (DE)

( * ) Notice: Subject to any disclaimer, the term of this patent is extended or adjusted under 35 U.S.C. 154(b) by 0 days.

(21) Appl. No.: 14/436,222

(22) PCT Filed: Oct. 17, 2013

(86) PCT No.: PCT/EP2013/071682
§ 371 (c)(1),
(2) Date: Apr. 16, 2015

(87) PCT Pub. No.: WO2014/060496
PCT Pub. Date: Apr. 24, 2014

(65) Prior Publication Data
US 2015/0319529 A1 Nov. 5, 2015

(30) Foreign Application Priority Data
Oct. 17, 2012 (DE) ........................ 10 2012 020 271

(51) Int. Cl.
*H03G 11/00* (2006.01)
*H04R 3/00* (2006.01)
(Continued)

(52) U.S. Cl.
CPC ............... *H04R 3/007* (2013.01); *H04R 3/02* (2013.01); *H04R 3/08* (2013.01); *H04R 29/001* (2013.01)

(58) Field of Classification Search
CPC ........ H04R 3/007; H04R 29/001; H04R 3/08; H04R 3/02
(Continued)

(56) References Cited

U.S. PATENT DOCUMENTS 4,709,391 A 11/1987 Kaizer et al.
5,438,625 A 8/1995 Klippel
(Continued)

FOREIGN PATENT DOCUMENTS

DE 43 32 804 A1 3/1995
DE 43 34 040 C2 4/1995
(Continued)

OTHER PUBLICATIONS

Ritter, Tobias et al.; "Modelling Viscoelasticity of Loudspeaker Suspensions using Retardation Spectra"; Audio Engineering Society Convention Paper 8217 presented at the 129 Convention, Nov. 4-7, 2010, San Francisco, CA, USA; 11 pages.
(Continued)

*Primary Examiner* — Vivian Chin
*Assistant Examiner* — Con P Tran
(74) *Attorney, Agent, or Firm* — Westman, Champlin & Koehler, P.A.

(57) ABSTRACT

An arrangement and method for converting an input signal into a mechanical or acoustical output signal by using a transducer and additional means for generating a desired transfer behavior and for protecting said transducer against overload. Transducers of this kind are for example loudspeaker, headphones and other mechanical or acoustical actuators. The additional means comprise a controller, a power amplifier and a detector. The detector identifies parameters of the transducer model if the stimulus provides sufficient excitation of the transducer. The detector permanently identifies time variant properties of the transducer for any stimulus supplied to the transducer. The controller provided with this information generates a desired linear or nonlinear transfer behavior; in particular electric control linearizes, stabilizes and protects the transducer against
(Continued)

electric, thermal and mechanical overload at high amplitudes of the input signal.

33 Claims, 9 Drawing Sheets

(51) Int. Cl.

| | |
|---|---|
| ***H04R 3/02*** | (2006.01) |
| ***H04R 3/08*** | (2006.01) |
| ***H04R 29/00*** | (2006.01) |

(58) Field of Classification Search
USPC ............ 381/55, 56, 58, 59, 120, 98; 367/13; 73/645, 647, 648, 646; 714/799, 25, 49
See application file for complete search history.

(56) References Cited

U.S. PATENT DOCUMENTS

| | | | |
|---|---|---|---|
| 5,523,715 A | 6/1996 | Schrader | |
| 5,528,695 A | 6/1996 | Klippel | |
| 5,577,126 A | 11/1996 | Klippel | |
| 5,694,476 A | 12/1997 | Klippel | |
| 5,815,585 A | 9/1998 | Klippel | |
| 6,058,195 A | 5/2000 | Klippel | |
| 6,059,195 A | 5/2000 | Adams et al. | |
| 6,269,318 B1 | 7/2001 | Geddes | |
| 6,931,135 B1 | 8/2005 | Kohut | |
| 7,372,966 B2 | 5/2008 | Bright | |
| 8,019,088 B2 | 9/2011 | Holman | |
| 8,058,195 B2 | 11/2011 | Fotou et al. | |
| 2005/0031139 A1 | 2/2005 | Browning et al. | |
| 2011/0015898 A1* | 1/2011 | Klippel ................ | H04R 29/001 702/185 |

FOREIGN PATENT DOCUMENTS

| | | |
|---|---|---|
| DE | 43 36 608 C2 | 5/1995 |
| EP | 1 743 504 B1 | 9/2011 |
| EP | 2 398 253 A1 | 12/2011 |
| EP | 2 453 670 A1 | 5/2012 |
| WO | 01/03466 A2 | 1/2001 |
| WO | 2011/076288 A1 | 6/2011 |

OTHER PUBLICATIONS

Klippel, Wolfgang; "Nonlinear Modeling of the Heat Transfer in Loudspeaker", J. Audio Eng. Soc., vol. 52, No. 1/2, Jan./Feb. 2004; 23 pages.
Office Action for Indian Patent Application No. 844/MUMNP/2015, dated Jul. 13, 2018, 5 pages.

* cited by examiner

METHOD AND ARRANGEMENT FOR CONTROLLING AN ELECTRO-ACOUSTICAL TRANSDUCER

CROSS-REFERENCE TO RELATED APPLICATION

This Application is a section 371 National Stage Application of International Application No. PCT/EP2013/071682, filed 17 Oct. 2013 and published as WO 2014/060496 A1 on 24 Apr. 2014, in English, the contents of which are hereby incorporated by reference in their entirety.

FIELD OF THE INVENTION

The invention generally relates to an arrangement and a method for converting an input signal z(t) into a mechanical or acoustical output signal p(t) by using a transducer and additional means for generating a desired transfer behavior and for protecting said transducer against overload. Transducers of this kind are loudspeakers, headphones and other mechanical or acoustical actuators. The additional means identify the instantaneous properties of the transducer and generate a desired linear or nonlinear transfer behavior by electric control; in particular linearize, stabilize and protect the transducer against electric, thermal and mechanical overload at high amplitudes of the input signal.

DESCRIPTION OF THE RELATED ART

Electro-acoustical transducers have inherent nonlinearities generating instabilities and signal distortion in the output signal p(t) which limit the useable working range. The U.S. Pat. No. 4,709,391 and U.S. Pat. No. 5,438,625 disclose a preprocessing of the input signal z(t) with the objective to reduce the distortion in the output signal p(t) and to linearize the overall system (controller+transducer). The control system exploits the result of the physical modeling of the electro-dynamical transducer, in which a nonlinear integro-differential equation $$u = R_e i + \frac{d(L(x)i)}{dt} + Bl(x)\frac{dx}{dt} \tag{1}$$

$$Bl(x)i = (K_{ms}(x) - K_{ms}(0))x + L^{-1}\{sZ_m(s)\} * x \tag{2}$$

describes the relationship between electrical terminal voltage u, input current i and voice coil displacement x by using the force factor $$Bl(x) = \sum_{i=0}^{N} b_i x^i, \tag{3}$$

the stiffness of the mechanical suspension $$K_{ms}(x) = \sum_{i=0}^{N} k_i x^i \tag{4}$$

and the voice coil inductance $$L(x) = \sum_{i=0}^{N} l_i x^i, \tag{5}$$

which are lumped nonlinear parameters depending on the displacement x of a mechanical vibration element such as the voice coil, diaphragm and suspension.

The linear parameters in Eqs. (1) and (2) are the voice coil resistance $R_e$ and the mechanical impedance $$Z_m(s) = \frac{\sum_{i=0}^{M} a_i s^i}{\sum_{i=0}^{M} c_i s^i} = \frac{K_{ms}(0)}{s} + R_{ms} + M_{ms}s + Z_{load}(s) \tag{6}$$

which is a rational transfer function using Laplace operator s. After applying the inverse Laplace transformation $L^{-1}\{\ \}$ the mechanical impedance can be convoluted by using the operator * with displacement x in the time domain. The coefficients $a_i$ and $c_i$ of the rational transfer function describe the mechanical stiffness $K_{ms}(x=0)$ at the rest position, the resistance $R_{ms}$, the moving mass $M_{ms}$ and the load impedance $Z_{load}(s)$, that represents coupled acoustical and mechanical system.

The order M describes the number of poles and zeros in the rational transfer function $Z_m(s)$. A transducer mounted in a sealed enclosure can be modeled by a second-order function $Z_m(s)$ while a vented box system, panel or in a horn increases the number of poles and zeros and makes the identification of the linear parameters more difficult.

The inventions disclosed in the U.S. Pat. No. 4,709,391, U.S. Pat. No. 5,438,625 can compensate undesired linear and nonlinear distortion if the transducer behaves stable and the free parameters of the model are accurately identified for the particular transducer.

The free parameters $P_j$ of the model summarized in the parameter vector $$\begin{aligned} P &= [\,P_1 \;\ldots\; P_j \;\ldots\; P_J\,]^T \\ &= [\,R_e \;\; a_0 \;\ldots\; a_M \;\; c_0 \;\ldots\; c_M \;\; b_0 \;\ldots\; b_N \;\; k_0 \;\ldots\; k_N \;\; l_0 \;\ldots\; l_N\,]^T \end{aligned} \tag{7}$$

have to be identified on each transducer adaptively while reproducing an ordinary audio signal (e.g. music), because environment, fatigue, aging and other external influences change the properties of the transducer over time. The inventions in DE 4332804 and U.S. Pat. No. 6,059,195 determine the parameter $P_j$ by minimizing an error signal $$e(t) = i'(t) - i(t), \tag{8}$$

that describes the difference between modeled current signal i'(t) and measured current i(t). The patents, U.S. Pat. No. 6,269,318, U.S. Pat. No. 5,523,715, DE 4334040 disclose an invention where an electro-dynamical transducer is used both as an actuator and sensor at the same time. Searching for the minimum of the mean squared errors in the cost function $$C=MSE=E\{e(t)^2\}\rightarrow\text{Min} \tag{9}$$

leads to following condition $$\frac{\partial C}{\partial P_j}=2e(t)\frac{\partial e}{\partial P_j}=2e(t)\frac{\partial i'(t)}{\partial P_j}=0 \quad j=1,\ldots,J \tag{10}$$

which is the basis for the determination of the optimal parameter values by using the Wiener-Hopf-equation:

$$P=R^{-1}Y=(E(G(t)G^H(t)))^{-1}E(i(t)G(t)) \tag{11}$$

The autocorrelation matrix R and the cross correlation matrix Y are calculated by using the expectation value E( . . . ) f from the measured input current i multiplied with the gradient vector G(t):

$$G(t)=[G_1\ \ldots\ G_j\ \ldots\ G_J]^T=\left[\frac{\partial i'(t)}{\partial P_1}\ \ldots\ \frac{\partial i'(t)}{\partial P_j}\ \ldots\ \frac{\partial i'(t)}{\partial P_J}\right]^T. \tag{12}$$

Alternatively the optimal parameter vector $$P_j[n]=P_j[n-1]+\mu_j e(t)G_j(t) j=1,\ldots,J \tag{13}$$

can iteratively be determined by using the stochastic gradient method (LMS-algorithm), whereupon the error signal e(t) is multiplied with the gradient signal $G_j(t)$ scaled by step size $\mu_j$ corresponding to the learning speed.

The known control and protection systems require a sufficiently accurate modeling of the transducer. The materials used in the mechanical suspension of the transducer, show a visco-elastic behavior, which cannot be represented by the nonlinear stiffness $K_{ms}(x)$ and the mechanical resistance $R_{ms}$. F. Agerkvist and T. Ritter developed a linear model of this behavior in the paper "Modeling Viscoelasticity of Loudspeaker Suspensions using Retardation Spectra" presented at the 129th Convention of the Audio Eng. Soc. in San Francisco, Nov. 4-7, 2010, preprint 8217. This model describes the transducer at small amplitudes but neglects the interaction with the nonlinear behavior in the large signal domain. This affects the prediction of the dc component generated by asymmetrical nonlinearities of the transducer.

The efficiency of an electro-dynamical transducer can be improved by using a motor with a nonlinear force factor Bl(x) without increasing the weight, size and costs. However, such an effective motor structure has the disadvantage that the mechanical vibration becomes unstable under certain conditions generating bifurcation, jumping effects that reduce distortion and reduce the amplitude of the output signal. Those instabilities cannot be compensated by control systems known in prior art. The U.S. Pat. No. 6,058,195 discloses a static shift of the voice coil rest position to the minimum of the stiffness characteristic or to the maximum of the force factor characteristic Bl(x). This approach is not sufficient for stabilizing the transducer under all conditions, because the measurement of the parameter vector P of the transducer requires persistent excitation of the transducer by the stimulus.

If the stimulus has a sparse spectrum and comprises only a few tones then the autocorrelation matrix R becomes positive semi-definite and the rank rk(R) of the autocorrelation matrix R is lower than the number J of the free parameters in the vector P. In this case there is no inverse of the matrix R and there are an infinite number of solutions for the optimization problem. The LMS-algorithm unlearns the optimal values of the transducer parameters and provides wrong results. Furthermore, a badly conditioned Matrix R reduces the learning speed and the accuracy of the parameter measurement process. Imperfections of the transducer model (e.g. viscoelastic behavior) and external influences (e.g. climate) cause time-varying transducer parameters and unpredictable changes of the transducer state due to instabilities (e.g. bifurcation) which cannot be identified by prior art in time. Without having valid state and parameter information the control system cannot compensate for signal distortion and cannot provide the desired transfer behavior in the overall system.

Active protection systems as disclosed in DE 4336608, U.S. Pat. No. 5,528,695, U.S. Pat. No. 6,931,135, U.S. Pat. No. 7,372,966, U.S. Pat. No. 8,019,088, WO2011/076288a1, EP 1743504, EP 2453670 and EP 2398253 also require a valid parameter vector P for predicting relevant state variables such as voice coil displacement x(t) and voice coil temperature $T_v(t)$ and for detecting an overload situation. For example, the stiffness of the mechanical suspension of a loudspeaker used in automotive applications will be significantly lower after parking the car for some time at high ambient temperatures and the stiffness value K[x=0,n−1] measured at low temperature gives a lower estimate of the voice coil peak displacement. Due to this discrepancy the protection system cannot prevent an overload of the mechanical system (e.g. voice coil bottoming) until valid parameters are identified.

The invention U.S. Pat. No. 5,528,695 discloses a mechanical protection system which predicts the peak displacement of the voice coil and attenuates the low frequency components of the input signal w(t) before the mechanical overload occurs. The prior art estimates the envelope of the displacement by using the Hilbert-transform or the velocity of the voice coil. The implementation of the prior art causes an additional time delay and phase distortion which impairs the accuracy of the predicted peak displacement and limits the reliability and performance of the protection system.

The inventions U.S. Pat. No. 6,058,195, US 2005/031139, WO 201/03466 and WO 2011/076288 disclose thermal protection systems which measure the dc resistance $R_e$ of the voice coil in the time or frequency domain which corresponds to the voice coil temperature $T_v$. If the measured value $T_v$ exceeds a permissible limit value $T_{lim}$, the input signal w(t) will be attenuated to avoid a thermal overload. The methods disclosed in the prior art generate a latency $t_m$ in the identified resistance $R_e$ corresponding to the FFT-length or learning speed of the adaptive algorithm. Due to the latency the voice coil temperature may temporally exceed the permissible limit $T_{lim}$ and may damage the transducer.

A thermal modeling of the transducer is disclosed by [1] W. Klippel in the paper "Nonlinear Modeling of the Heat Transfer in Loudspeakers" in J. Audio Eng. Society 52, vol. 52, no. 1, 2, pp. 3-25 (2004), where the voice coil temperature $T_v$ is derived from thermal parameters. This alternative approach also provides no reliable protection of the transducer, because external factors of influences (e.g. ambient temperature) are not considered in the simulation.

A nonlinear control system, which compensates for asymmetries in the transducer nonlinearities, generates a dc component $w_=$ in the output signal w(t), that has to be transferred via a power amplifier to the transducer terminals. However, power amplifiers as used in audio applications have a high-pass characteristic and attenuate this dc signal and other low frequency components that may damage the transducer while passing the normal audio signal at higher frequencies. The attenuation of the dc-signal generated by the nonlinear control generates a discrepancy between the state variables in the control system and the real transducer which impairs the linearization and the reliable protection of the transducer.

OBJECTS OF THE INVENTION

Many consumer and professional applications require a small and light audio reproduction system that generates the output signal at sufficient amplitude, sound quality and efficiency while using a minimum of hardware resources, power and manufacturing effort. The control system shall generate a desired transfer behavior, ensure stability under all conditions and protect the transducer against thermal and mechanical overload caused by high amplitudes of the stimulus. To simplify the operation of the system, a detector shall identify all relevant properties of the transducer adaptively by reproducing an arbitrary signal including music to compensate for aging, fatigue, climate, change of the mechanical and acoustical load and faulty operation by the user. The control system should avoid any additional mechanical and acoustical sensor and should cope with any latency caused by AD and DA converters and high-pass characteristic of conventional power amplifier.

SUMMARY OF THE INVENTION

According to the present invention the passive transducer is optimized with respect to size, weight, cost, efficiency, directivity and other properties which cannot be compensated virtually by electrical control and signal processing. For example a motor structure with a short voice coil overhang combined with soft mechanical suspension gives the highest sensitivity and efficiency and the lowest cut-off frequency for given cost and hardware resources. However, this kind of transducer will generate significant nonlinear signal distortion and may become unstable under certain conditions (e.g. bifurcation above resonance frequency).

The undesired behavior of the transducer can be suppressed by a controller provided permanently with information on instantaneous transducer properties and behavior identified by an adaptive detector.

The controller stabilizes, protects, linearizes and equalizes the transducer at any time for any input stimulus. Active stabilization of the transducer is a new feature disclosed in the invention and a fundamental requirement for solving the other control objectives (protection, linearization and equalization). Stabilization and protection require a very short response time of the identification and control process. According to the invention this problem is solved by introducing a separate identification process for highly time varying properties of the transducer and by anticipating critical states by exploiting a priori information form physical modeling.

Both detector and controller are based on a model using slowly time varying parameters, highly time variant properties and state variables. The moving mass $M_{ms}$ is an almost time invariant parameter. Other parameters change slowly over time while other properties vary significantly within a short time period (less than 1 s). State variables such as displacement, current, sound pressure depend on the instantaneous stimulus supplied to the terminals.

It is a unique feature of the invention that three nonlinear parameters $$Bl(x) = \sum_{i=0}^{N} b_i (x + x_{off}(t))^i \tag{14}$$

$$K_{ms}(x) - K_{ms}(0) = \sum_{i=1}^{N} k_i (x + x_{off}(t))^i$$

$$L(x) = \sum_{i=0}^{N} l_i (x + x_{off}(t))^i$$

are modeled by using a common offset $x_{off}(t)$ from the voice coil rest position. The offset $x_{off}(t)$ is highly time variant and depends on the dynamic generation of a dc-displacement, visco-elastic behavior of the suspension at low frequency, the gravity and other external influences. By introducing the offset $x_{off}(t)$ the time variance of the coefficients $b_i$, $k_i$ and $l_i$ in Eq. (14) can significantly be reduced because those coefficients depend on motor and suspension geometry only.

The stiffness $K_{ms}(x=0)$ of the suspension at the rest position x=0 is also highly time variant due to visco-elastic behavior of the suspension and climate dependency. Separating the stiffness variation $k_v(t)$ in Eq. (2) yields $$Bl(x)i = (K_{ms}(x) - K_{ms}(0))x + k_v(t)x + L^{-1}\{sZ_m(s)\}*x \tag{15}$$

in which the stiffness at the rest position $K_{ms}(0)$ and mechanical impedance $Z_m(s)$ becomes more time invariant and can be updated in slow learning process.

The exact estimation of instantaneous electrical dc-resistance $R_e(t)$ in Eq. (1) is a fundamental requirement for adaptive determination of $x_{off}(t)$ and $k_v(t)$. The direct measurement of $R_e(t)$ in the frequency or time domain as disclosed in prior art is too slow to follow the fast changes of $R_e(t)$ caused by the dissipation of the power supplied by the stimulus. For this reason an additional time varying parameter $r_v(t)$ is introduced in equation $$u = R_e i + r_v(t) i + \frac{d(L(x)i)}{dt} + Bl(x)v \tag{16}$$

which reduces the variance of parameter $R_e$. The instantaneous resistance variation $r_v(t)$ can be estimated from the input power $$P_e(t) = \frac{1}{T}\int_0^T u(t-t')i(t-t')dt' \tag{17}$$

by calculating a predicted resistance variation $$r_p(t) = R_e \alpha R_{TC} P_e(t) \tag{18}$$

and performing a first order integration $$r_v(t) = (1-\epsilon) r_v(t-\Delta t) + \epsilon r_p(t) \tag{19}$$

by using thermal and electrical parameters of the transducer such as thermal resistance $R_{tc}$, thermal time constant $\epsilon$ and thermal conduction coefficient $\alpha$. Those parameters are almost time invariant and can be identified by a slow learning process in the detector and are submitted via the parameter vector P to the controller.

The detector identifies the voice coil offset $x_{off}(t)$, stiffness variation $k_v(t)$ and resistance variation $r_v(t)$ and provides this information in a time variant property vector $$S*(t) = [S_1(t) \ \ldots \ S_k(t) \ \ldots \ S_K(t)]^T = [x_{off}(t) \ k_v(t) \ r_v(t) \ \ldots]^T \tag{20}$$

permanently to the controller. The properties in vector S*(t) may be interpreted as parameters but have a much higher time variance than the elements of parameter vector P due to unmodelled dynamics, varying acoustical load, interaction of the human operator, climate, and other external influence. The properties in vector S*(t) may also be interpreted as state variables because the resistance variation $r_v(t)$, for example, directly corresponds to the voice coil temperature $T_v(t)$. However, the components in vector S*(t) are incoherent with the (audio) input signal z(t) and not predictable like other state variables of the transducer such as displacement x(t), input current i(t), displacement x(t), velocity v(t) and sound pressure p(t). Therefore, the identification of time variant properties in vector S*(t) should be permanently active to stabilize, protect, linearize and equalize the transducer for any input signal z(t).

The vector S*(t) also differs from other state variables because the signals in S*(t) comprise only spectral components at very low frequencies far below the audio band. The vector S*(t) may be transferred from the detector to the controller with some latency. This is not possible in servo feedback systems that are used in prior art for stabilizing systems.

By separating the strongly time variant parameters in vector S*(t) the remaining parameters in vector P have a lower time variance. If the learning process in the detector is deactivated the last update of the parameter estimate P[n] is stored in a memory and may be used as an initial value when the learning process in the detector is reactivated. There is no need to store the time variant property vector S*(t) because its expectation value E{S*(t)}=0 and this vector provide no information valid over a longer time period.

If the stimulus provides not sufficient excitation of the transducer and the rank rk(R) of the autocorrelation matrix R is lower than the number J of the free parameters in the vector P then the estimation of transducer parameters that have the lowest time variance (e.g. moving mass) will temporarily be deactivated to ensure a positive definite autocorrelation matrix R of the remaining elements in the reduced parameter vector P.

The identification of the time variant property vector S*(t) is always active and is performed at high learning speed to provide valid information to the controller at any time. The detector can also cope with any stimulus that provides a unique and optimal estimate of S*(t) because the gradient signals in G*(t) remain independent and the autocorrelation matrix $$R^*=E(G^*(t)G^{*H}(t)) \tag{21}$$

stays positive definite even for a single tone which is the most critical stimulus.

It is also a further feature of the invention to use a minimal number of free parameters in the transducer model which have to be identified by the detector. For each parameter $P_j$ a new characteristic called importance value $W_j$ is calculated which assesses the contribution of this parameter to the reduction of mean squared modeling error in the cost function C. An $i^{th}$-parameter with low importance value $W_i$ is removed from the model to simplify the identification process. A less complex model with lower number of free parameters also increases the robustness of identification process and reduces the processing load of the detector. This is important for finding an optimal number M of poles and zeros in the mechanical transfer $Z_m(s)$ in Eq. (6) and for reducing the order N of the power series expansion of the nonlinear parameters.

The controller in the current invention generates a dc component in the control output which has to be transferred via a power amplifier to the terminals of the transducer. If the power amplifier has a high-pass characteristic which attenuates spectral components below the audio band the controller compensates for the dc signal $w_=$ in controller output signal w(t) by generating a corresponding dc signal y=added to the control input signal z(t).

If the power amplifier can transfer a dc signal then the controller can compensate the offset $x_{off}$ by generating a dc voltage $z_{off}$ added to the control input signal z(t).

The gain $G_v$ of power amplifiers is usually not constant, but can be changed manually or varies with the supply voltage in battery-powered audio devices which impairs the active stabilization, linearization, protection provided by the controller. Thus, the detector has to identify permanently the gain $G_v$ and the controller has to compensate the instantaneous variation of gain $G_v$ actively.

According to the invention active stabilization, linearization and equalization is closely related and should be combined with active protection of the transducer against mechanical and thermal overload generated by high amplitudes of the input signal. The controller calculates the instantaneous voice coil temperature $$T_v(t)=(R_{e,i}(t)/R_e(t=0)-1)/\alpha+T_v(t=0) \tag{22}$$

from instantaneous voice coil resistance $$R_{e,i}(t)=R_e+r_v(t) \tag{23}$$

and attenuates the input signal w(t) if the voice coil temperature $T_v(t)$ exceeds a permissible limit value $T_{lim}$. The instantaneous resistance variation $r_v(t)$ is calculated from the input power according to Eq. (17) to consider the influence of the stimulus while the parameter $R_e$ is identified by measurement to capture the influence of the ambient temperature $T_a$.

By combining thermal modeling of $r_v(t)$ and direct measurement of $R_e$ the voice coil temperature $T_v(t)$ can be determined without latency to activate the thermal protection system in time and avoid an overshoot of the peak value of the temperature over limit peak value $T_{lim}$.

The performance and robustness of the thermal protection system can be further improved by using instead of the instantaneous resistance variation $r_v(t)$ the predicted resistance variation $r_p(t)$ according to Eq. (18) giving the predicted voice coil resistance $$R_{e,p}(t)=R_e+r_p(t) \tag{24}$$

corresponding to the steady-state value of the voice coil temperature.

Prediction of the peak value of the displacement is also crucial for providing a reliable protection of the voice coil, cone or other moving parts of the mechanical system. Contrary to the prior art U.S. Pat. No. 5,528,695 the maximal peak value is not derived from the envelope of the signal but is determined by nonlinear prediction using the instantaneous position $x'+x_{off}$ simulated by the nonlinear transducer model using the parameter vector P and vector S* provided by the detector. It is an important feature of the invention that the instantaneous position is determined by considering the displacement x' and the instantaneous offsets $x_{off}(t)$ from the voice coil rest position because the offset $x_{off}(t)$ moves the coil to the nonlinear region of the suspension or to the back plate where bottoming may occur.

The nonlinear prediction uses the instantaneous voice coil position $x'+x_{off}$ and its higher-order derivatives to split the movement into characteristic phases describing acceleration and deceleration of the voice coil. For each phase a particular nonlinear model is used to anticipate the peak value of the displacement. The anticipated peak value may be significantly higher than the instantaneous envelope of the displacement as used in prior art. The nonlinear prediction detects a critical mechanical overload early enough to activate a high-pass with controllable cut-off frequency relatively slowly to attenuate the low frequency components of the input signal while avoiding audible artifacts and additional signal distortion which degrade the sound quality.

The controller requires valid values in the parameter vector P even if the transducer is excited by the stimulus for the first time and the detector has not yet identified the properties of the particular transducer. This is crucial for providing a reliable protection of the transducer especially during start-up. According to the current invention the controller reduces the control gain $G_w$ during start-up and operates the transducer in the safe small signal domain until the transducer has been sufficiently excited by the stimulus and valid parameters in vector P have been identified by the detector. The permissible limits of the working range are derived from the nonlinear and thermal parameters of the transducer connected to the detector. According to the invention the instantaneous offset $x_{off}$ of the voice coil position has to be considered. After activating the protection system the control gain $G_w(t_1)$ will be increased to operate the transducer in the large signal domain. The control gain $G_w(t_1)$ can be stored with the parameter vector P and used as a starting value when the controller resumes after power down.

The initial identification can be speeded up by using instead of an arbitrary input signal z(t) a steady-state signal s(t) generated in the control system to ensure persistent excitation of the transducer.

The transducer can be stabilized by additional provisions and passive means. According to the invention it is useful to operate transducers with a soft suspension in a sealed enclosure instead of in a vented box. The additional stiffness of the enclosed air volume shifts the system resonance frequency $f_t$ above the resonance frequency $f_s$ of the transducer and reduces the frequency region where instabilities occur. However, the dc force generated by transducer nonlinearities will not see the air stiffness because also a sealed loudspeaker enclosure has an intended leakage to compensate for varying static air pressure. Thus the dc force will generate a high dc displacement due to low value of the remaining suspension stiffness. Although the dc displacement cannot accurately be predicted by the model the detector identifies this dc displacement as an offset $x_{off}$ which can be compensated by the controller after a reaction time $t_m$. The dc displacement follows the dc force by a time constant τ which should be longer than the reaction time of the controller ($\tau > t_m$). This condition can be easily realized using a proper size of the leakage and air volume of the box.

These and other features, aspects and advantages of the present invention will become better understood with reference to the following drawings, description and claims.

BRIEF DESCRIPTION OF THE DRAWINGS

In all figures of the drawings elements, features and signals which are the same or at least have the same functionality have been provided with the same reference symbols, unless explicitly stated otherwise.

DETAILED DESCRIPTION OF THE INVENTION

Figure 1:
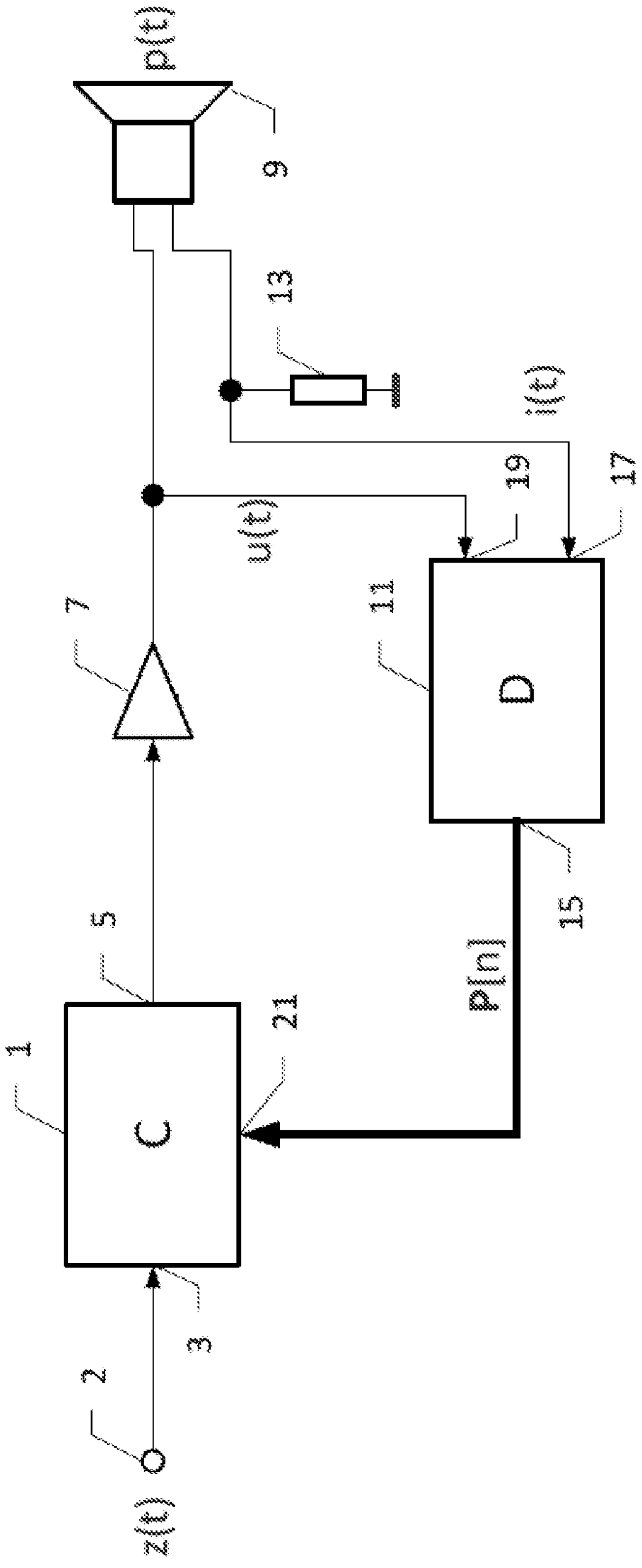
Fig. 1 (Prior Art)
FIG. 1 shows an active transducer system according to prior art.

FIG. 1 shows an active transducer system according to prior art for controlling a transducer 9. A controller 1 receives an input signal z(t) via input 3 and generates a control output signal w(t) at output 5, which is supplied via power amplifier 7 as an amplified control output signal to the input of transducer 9. The input current i(t) of the transducer measured by sensor 13 and the terminal voltage u(t) is supplied to the inputs 17 and 19 of the detector 11. Detector 11 generates a parameter vector P[n] at parameter output 15, which is supplied to a parameter input 21 of the controllers 1.

Figure 2:
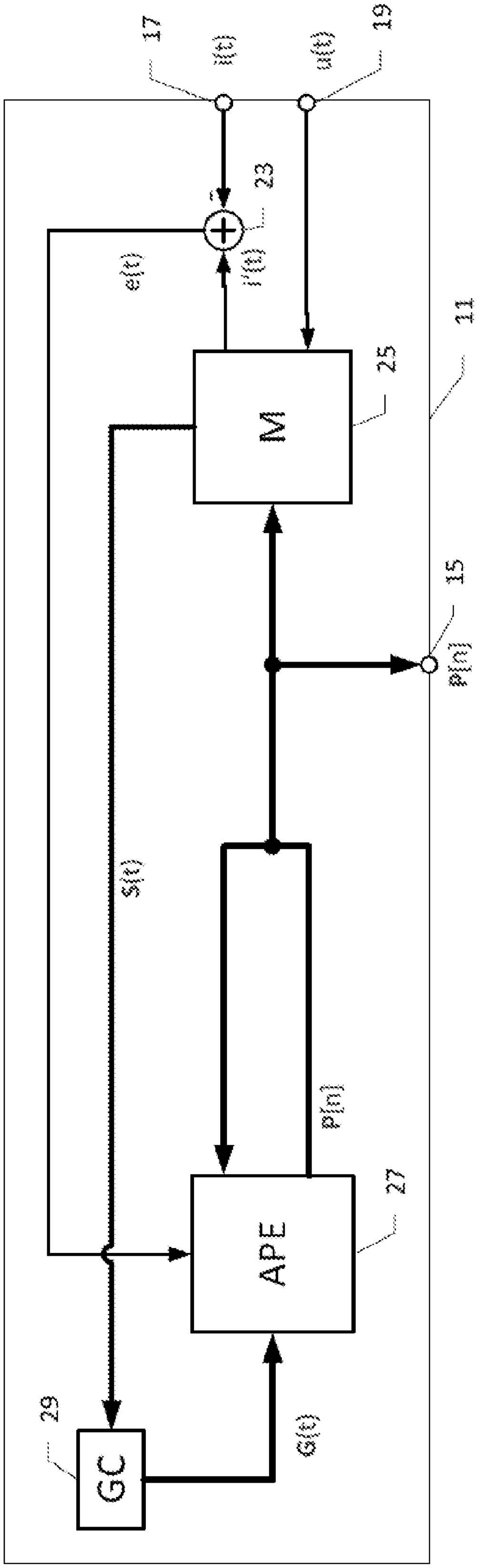
Fig. 2 (Prior Art)
FIG. 2 shows an adaptive detector according to prior art.

FIG. 2 shows an adaptive detector 11 according to prior art. A model device 25 provided with the terminal voltage u(t) from input 19 generates an estimated current signal i'(t) which is supplied to a non-inverting input of an error generator 23. Error generator 23 has also an inverting input provided with the measured current signal i(t) from input 17 and an output generating an error signal e(t) according to Eq. (8) supplied to the input of the parameter estimator 27. The model device 25 corresponding to Eqs. (1) and (2) generates a state vector S(t). A gradient calculation systems 29 receives the state vector S(t) and generates a gradient vector G supplied to the parameter estimator 27. The parameter estimator 27 generates according to Eq. (13) the parameter vector P[n], supplied both to the model device 25 as to parameter output 15 according to prior art.

Figure 3:
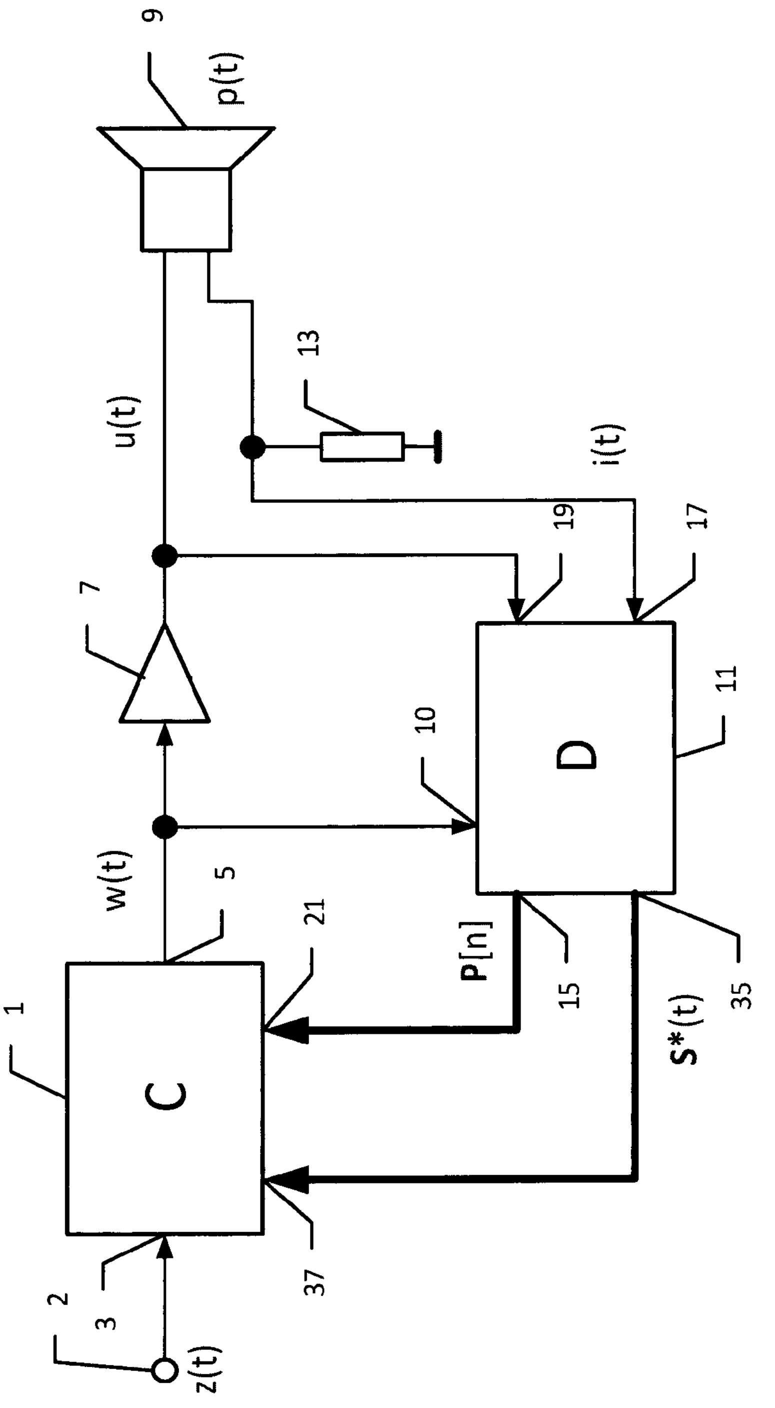
FIG. 3 shows an active transducer system in accordance with the present invention.

FIG. 3 shows an active transducer system in accordance with the present invention. The detector 11 has a property output 35 providing a time variant property vector S*(t) corresponding to Eq. (20), which is permanently supplied to the additional input 37 of the controller 1.

Figure 4:
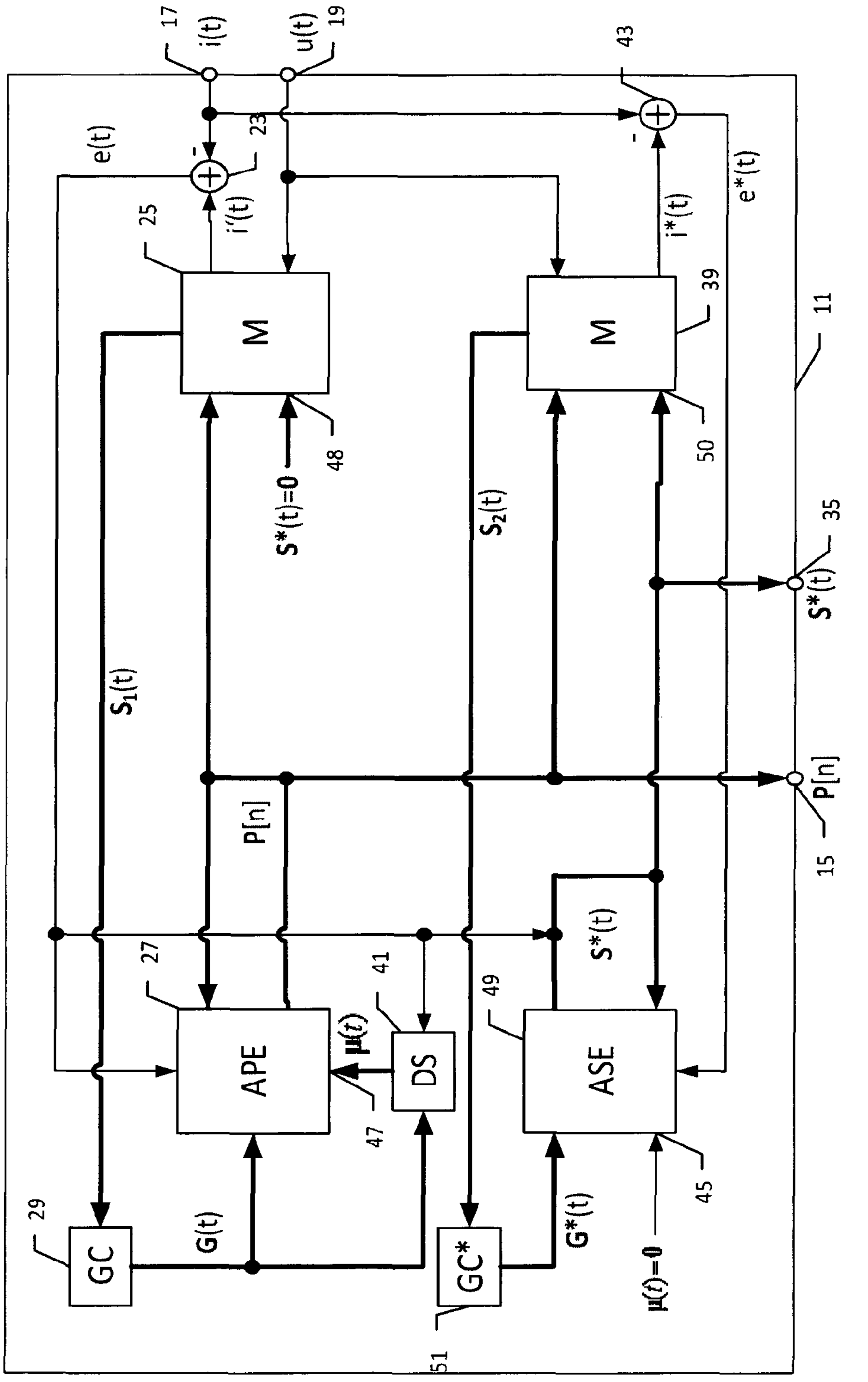
FIG. 4 shows an embodiment of the detector by using two transducer models for the separate estimation of the parameter vector P and time variant property vector S*.

FIG. 4 shows an embodiment of detector 11 in accordance with the present invention. Detector 11 comprises the error generator 23, the gradient calculation system 29, and the parameter estimator 27, connected in the same way as the corresponding elements in FIG. 2. A first model device 25 in accordance to Eqs. (14), (15) and (16) comprises an additional input 48, supplied with the null vector S*(t)=0.

An activator 41 generates a control vector μ(t) supplied to control input 47 of the parameter estimator 27 that determines the step size in the adaptive LMS algorithm in Eq. (13). If the importance value $W_j$ parameter $P_j$ is below a defined threshold $w_{lim}$ the activation signal (step size)

$$\mu_j = \begin{cases} \mu_0 & \text{if } W_j \geq w_{lim} \\ 0 & \text{if } W_j < w_{lim} \end{cases} \quad j = 1, \ldots, J \tag{25}$$

and the parameter will be zeroed. This excludes parameter $P_j$ permanently from the transducer modeling and reduces the free number $J_{op}$ of parameters in vector P[n].

The importance value $$W_j = J\frac{E((P_jG_j(t))^2)}{\sum_{i=1}^{J} E((P_iG_i(t))^2)} \quad j = 1, \ldots, J \tag{26}$$

can be calculated by using parameter $P_j$ and the gradient signal $G_j(t)$ from Eq. (12) or by calculating the contribution of parameter $P_j$ in the reduction of the total cost function C in Eq. (9) by $$W_j = J\frac{C(P_j) - C}{\sum_{i=1}^{J} (C(P_i) - C)} \quad j = 1, \ldots, J \tag{27}$$

The partial cost function $C(P_j)$ describes mean squared error for setting parameter $P_j=0$ and using optimal values for the remaining parameters $P_i$ with i=1, . . . , J and i≠j.

The activator 41 deactivates temporarily the learning process of the parameter $P_j$ with the lowest variance $v(P_j)$ if the stimulus does not provide persistent excitation of the transducer and the correlation matrix R in Eq. (11) becomes positive semi-definite. After rearranging the element in parameter vector P according to decreasing time variance $v(P_j)>v(P_{j+1})$ with j=1, . . . , J−1 the learning constant in vector control vector p(t) are calculated by $$\mu_j = \begin{cases} \mu_0 & \text{if } j \leq rk(R) \\ 0 & \text{if } j > rk(R) \end{cases} \quad j = 1, \ldots, J \tag{28}$$

The detector 11 contains a second model 39 that is identical with model 25 and also provided with the voltage signal u(t) and the parameter vector P[n]. It generates a predicted current signal i*(t) supplied to a second error generator 43 which generates an error signal e*(t)=i*(t)−i(t).

The state vector $S_2(t)$ generated in the model 39 is supplied to the input of a second gradient calculation system 51, which generates the gradient vector $$G^*(t) = [G_1^* \ \ldots \ G_k^* \ \ldots \ G_k^*]^T = \left[\frac{\partial i'(t)}{\partial S_1} \ \ldots \ \frac{\partial i'(t)}{\partial S_k} \ \ldots \ \frac{\partial i'(t)}{\partial S_K}\right]^T. \tag{29}$$

A permanent estimator 49 provided with error e*(t) and the gradient signal G*(t) generates the time variant property vector S*(t) supplied to a property output 35 of the detector and to the input 50 of the second model 39 as well. The input 48 of the first model 25 is supplied with a null vector S*(t)=0 to generate a constraint that ensures the unique solution of parameter vector P.

Figure 5:
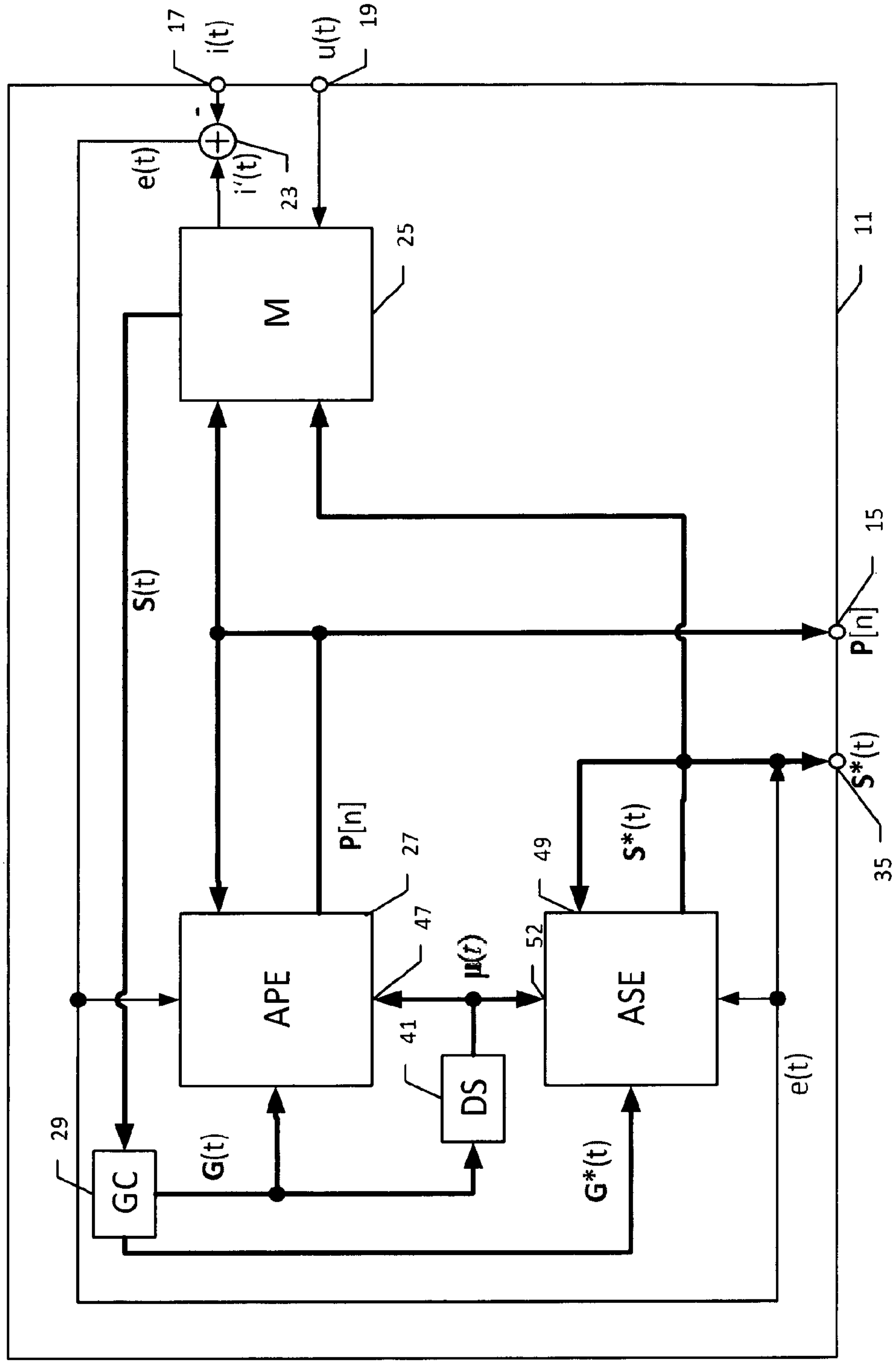
FIG. 5 shows an embodiment of the detectors by using one transducer model for separate estimation of the parameter vector P and time variant property vector S*.

FIG. 5 shows an alternative embodiment of the detectors 11 by dispensing the second model 39, the error generator 43 and the gradient calculation system 51. The permanent estimator 49 is provided with the error signal e(t) from the error generator 23, the gradient signal G*(t) from the gradient calculation system 29. The control vector μ(t) from activator 41 is also supplied to a control input 52 and used as a decay constant in the alternative embodiment.

For example, the voice coil offset $x_{off}$ can iteratively be determined by using a modified LMS algorithms $$x_{off}[n] = (1 - \mu_j)x_{off}[n-1] + \mu^* e(t)\frac{\partial e(t)}{\partial x_{off}} \tag{30}$$

by using the gradient $$\frac{\partial e(t)}{\partial x_{off}} = \frac{\partial i'(t)}{\partial Bl(x)}\frac{\partial Bl(x)}{\partial x_{off}} + \frac{\partial i'(t)}{\partial K_{ms}(x)}\frac{\partial K_{ms}(x)}{\partial x_{off}} + \frac{\partial i'(t)}{\partial L(x)}\frac{\partial L(x)}{\partial x_{off}} \tag{31}$$

with a learning constant μ* and a decay constant $\mu_j$, that corresponds with the learning constant for the nonlinear coefficients $b_i$, $k_i$, $l_i$, in Eq. (14).

The stiffness variation $$k_v[n] = (1 - \mu_j)k_v[n-1] + \mu^* e(t)\frac{\partial e(t)}{\partial k_v}) \tag{32}$$

can be estimated by the same algorithms using a decay constant $\mu_j$ that corresponds to the learning constant of the linear coefficients $a_i$, $c_i$, in Eq. (6).

The adaptive learning process of $x_{off}(t)$ and $k_v(t)$ is permanently performed by using a high learning speed ($|\mu^*| >> |\mu_j|$) in contrast to the updating of the parameters in vector P. The decay constant $\mu_j$ in Eqs. (30) and (32) generates additional constraints $$E(x_{off})=0$$

$$E(k_v)=0, \tag{33}$$

to ensure a unique solution of the parameter identification.

The permanent estimator 49 in the first embodiment of the detector in FIG. 4 receives a null vector μ(t)=0 at the control input 45 which deactivates the decay constants $\mu_j$ in Eqs. (30) and (32).

Figure 6:
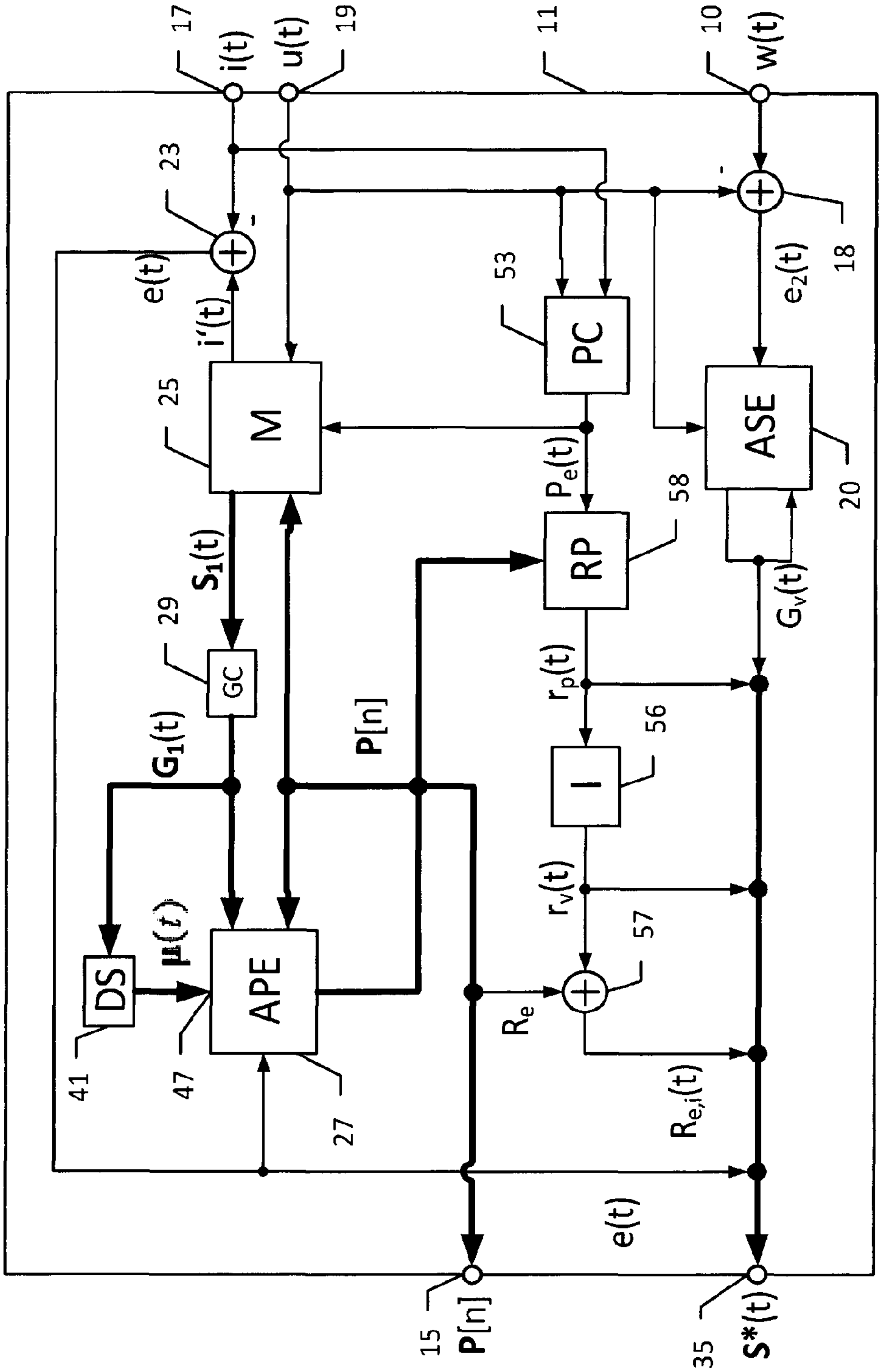
FIG. 6 shows an embodiment of the detector for estimating the predicted voice coil resistance.

FIG. 6 shows an embodiment of the detector 11 for determining the instantaneous resistance variation $r_v(t)$ and the predicted resistance variation $r_p(t)$. A power estimator 53 is provided with measured current signal i(t) and voltage signal u(t) and generates the instantaneous electric input power $P_e(t)$ of the transducer 9 according to Eq. (17). The resistance predictor 58 provided with input power $P_e(t)$ and parameter vector P generates the predicted resistance variation $r_p(t)$ and the following integrator 56 generates the instantaneous resistance variation $r_v(t)$ according to Eq. (18). The adder 57 provided with the slow time varying parameter $R_e$ and resistance variation $r_v(t)$ produces the instantaneous voice coil resistance $R_{e,i}(t)$ in accordance with Eq. (23). The variables $r_p(t)$, $r_v(t)$ and $R_{e,i}(t)$ are supplied in the time variant property vector S*(t) to other components of detectors 11 and via property output 35 to controller 1.

The detector 11 has an additional input 10 provided with output signal w(t) from output 5 of controllers 1 as shown in FIG. 3. A third error generator 18 provided with w(t) and terminal voltage u(t) from input 19 generates an error signal $e_2(t)=w(t)-u(t)$. A permanent estimator 20 provided with error signal $e_2(t)$ and terminal voltage u(t) identifies the instantaneous gain $G_v(t)$ of the power amplifier 7 and supplies this value via time variant property vector S*(t) to the input 37 of the controller 1.

Figure 7:
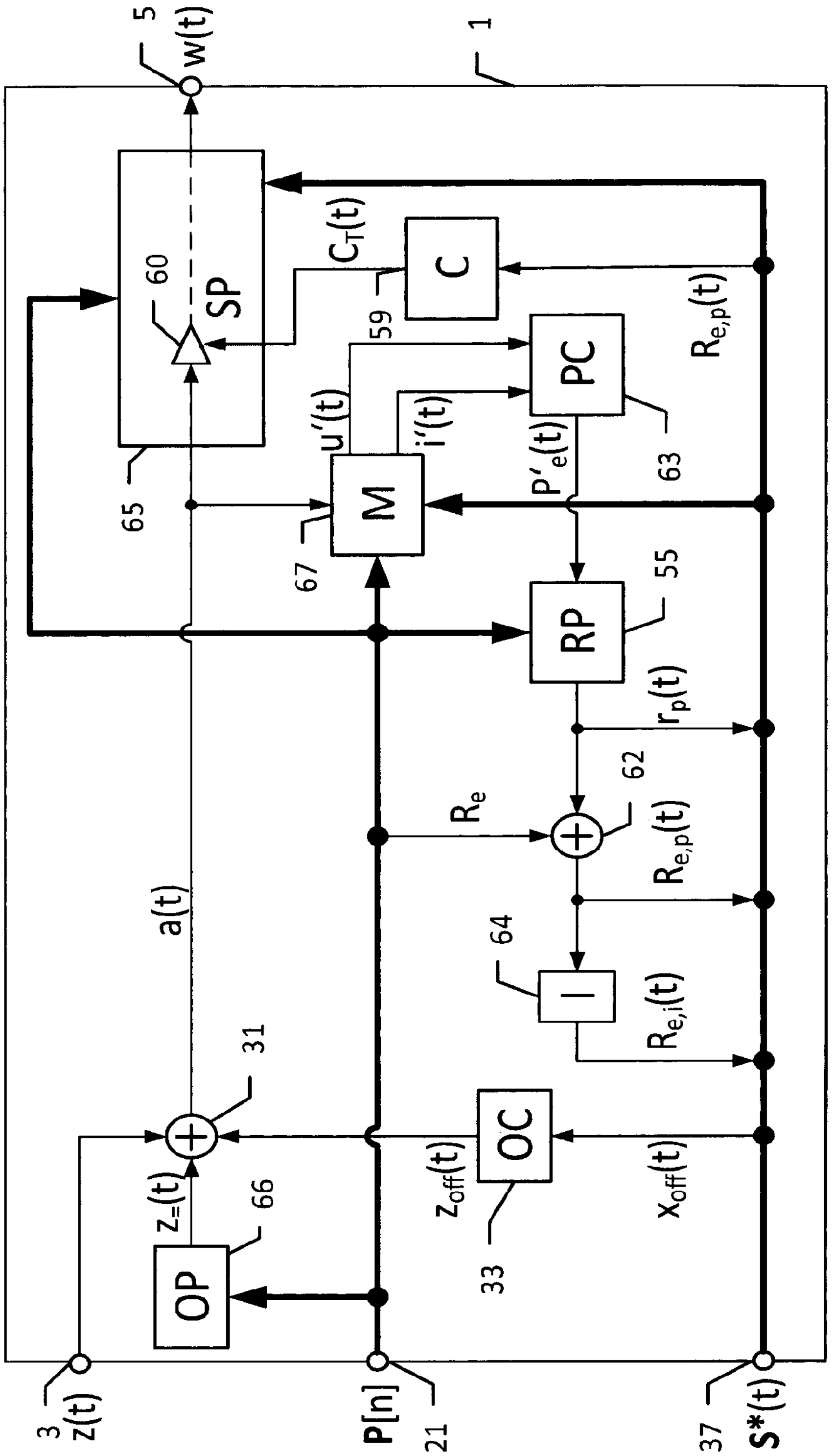
FIG. 7 shows an embodiment of the controller in accordance with the present invention.

FIG. 7 shows an alternative embodiment of the invention for estimating the predicted resistance $R_{e,i}(t)$ and the instantaneous resistance $R_{e,i}(t)$ of the voice coil in controller 1. A model 67 provided with the stimulus a(t), parameter vector P and time variant property vector S*(t) generates the electric voltage u'(t) and current i'(t) at the terminals of the transducer 9 which is an input of the power estimator 63. The input power $P'_e(t)$ calculated by Eq. (17) is supplied to a predictor 55 generating the predicted resistance variation $r_p(t)$ according to Eq. (18) by using parameter vector P. The adder 62 combines $r_p(t)$ with resistance value $R_e$ identified by the detector with unavoidable latency and generates the predicted value $R_{e,p}(t)$ of the voice coil resistance. The integrator 64 provided with predicted value $R_{e,p}(t)$ generates the instantaneous resistance $R_{e,i}(t)$ considering the thermal dynamics of the heating and cooling process. The variables $r_p(t)$, $R_{e,p}(t)$, $R_{e,i}(t)$ are supplied in the time variant property vector S*(t) both to the model 67 and to the transfer element 65.

A comparator 59 compares the predicted value $R_{e,p}(t)$ with a threshold $R_{lim}$, which corresponds to maximal voice coil temperature $T_{lim}$ and activates an attenuation element 60 in transfer element 65 via the control signal $C_t(t)$ if the condition $R_{e,p}(t)>R_{lim}$ indicates a thermal overloading of the transducer. By generating an attenuated input signal in time the instantaneous resistance $R_{e,i}(t)$ and voice coil temperature $T_v(t)$ will not exceed the allowed thresholds $R_{lim}$ and $T_{lim}$, respectively.

The adder 31 generates the input signal of the transfer element 65

$$a(t)=z(t)+z_{=}(t)+z_{off}(t) \tag{34}$$

by adding a dc signal $z_{=}(t)$ and a correction signal $z_{off}(t)$ to the control input z(t) from input 3. The offset compensator 33 generates iteratively the correction signal $$z_{off}[n]=z_{off}[n-1]+\mu_{=}x_{off} \tag{35}$$

by using the identified offset $x_{off}$ in vector S*(t) and a learning constant $\mu_{=}$. The correction system 66 provided with parameter vector P generates a dc signal $z_{=}(t)$ in accordance with Eq. (8) in U.S. Pat. No. 6,058,195 and corrects the static rest position of the voice coil.

Figure 8:
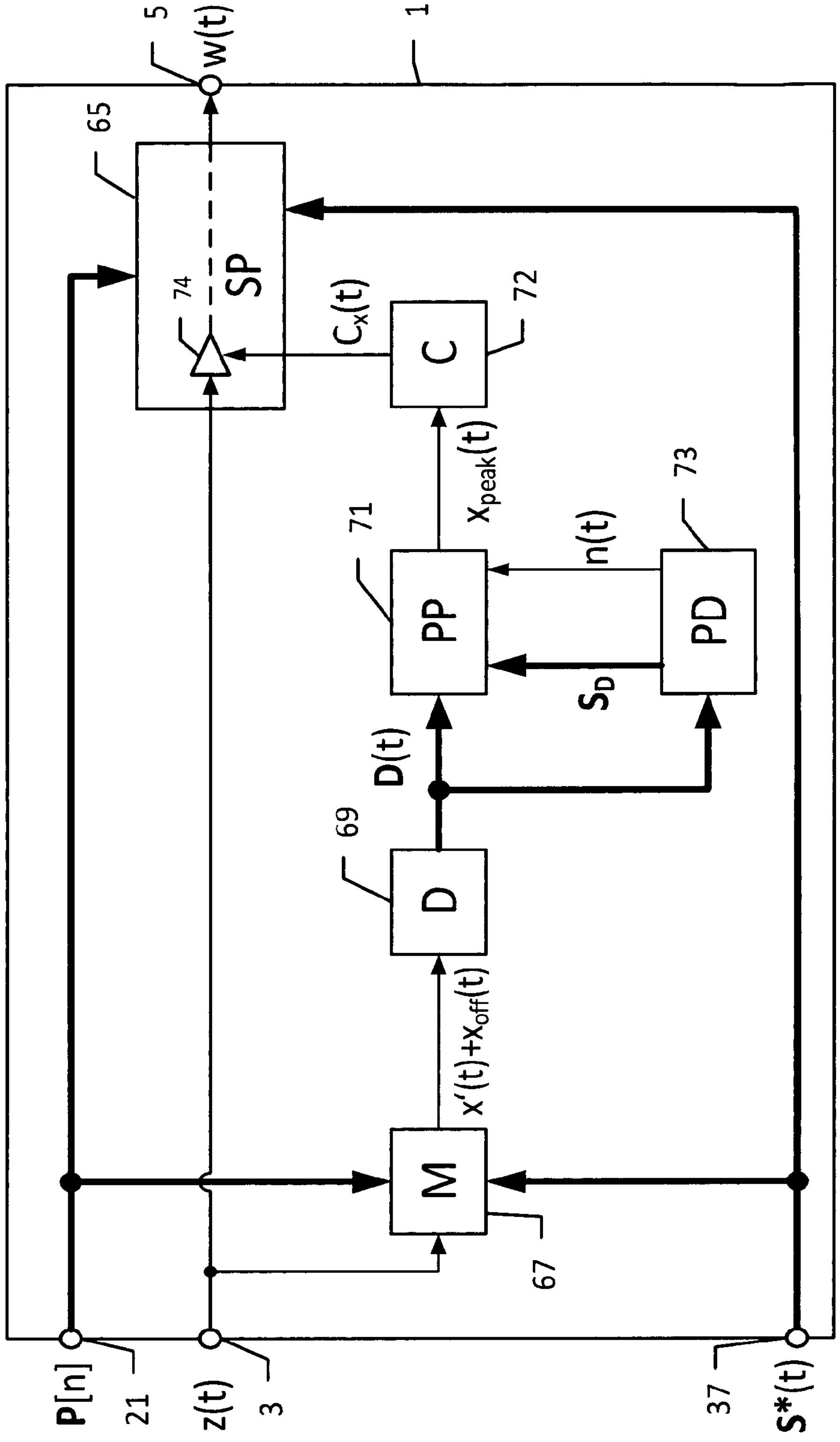
FIG. 8 shows an embodiment of mechanical protection system.

FIG. 8 shows an embodiment of the controller 1 for protecting transducer 9 against mechanical overload in accordance with the invention. In contrast to prior art the model 67 is provided with parameter vector P and with the time variant property vector S*(t) and generates the instantaneous voice coil position $x'(t)+x_{off}(t)$. The following differentiator 69 calculates the first and higher-order derivative of the voice coil position and summarizes those signals in a vector:

$$\begin{aligned} D(t) &= [\,x'(t)+x_{off}(t) \quad v(t) \quad a(t) \quad j(t)\,] \\ &= \left[ x'+x_{off} \quad \frac{d(x'+x_{off})}{dt} \quad \frac{d^2(x'+x_{off})}{dt^2} \quad \frac{d^3(x'+x_{off})}{dt^3} \right] \\ &\approx \left[ x'+x_{off} \quad \frac{dx'}{dt} \quad \frac{d^2x'}{dt^2} \quad \frac{d^3x'}{dt^3} \right] \end{aligned} \tag{36}$$

In contrast to predictive protection systems disclosed in prior art the vector D considers the accurate position of the voice coil calculated from the time varying properties of the transducer such as offset $x_{off}$, the stiffness variation $k_v(t)$ and the instantaneous resistance variation $r_v(t)$ in vector S*(t) and contains the acceleration a and the jerk j of the voice coil movement.

A phase detector 73 provided with vector D identifies the phase number $$n(t) = \begin{cases} 1 & \text{if } ((x'+x_{off})v > 0)\ \&(va < 0)\ \&(aj > 0) \\ 2 & \text{if } ((x'+x_{off})v < 0)\ \&(va > 0)\ \&(aj < 0) \\ 3 & \text{if } ((x'+x_{off})v > 0)\ \&(va > 0)\ \&(aj > 0) \\ 4 & \text{if } ((x'+x_{off})v > 0)\ \&(va > 0)\ \&(aj < 0) \\ 5 & \text{if } ((x'+x_{off})v > 0)\ \&(va < 0)\ \&(aj < 0) \\ 6 & \text{if } ((x'+x_{off})v < 0)\ \&(va > 0)\ \&(aj > 0) \\ 7 & \text{if } ((x'+x_{off})v < 0)\ \&(va < 0) \end{cases} \tag{37}$$

of the voice coil movement by using the velocity v, acceleration a and jerk j. The phases can be interpreted as:

n=1: deceleration outwards
n=2: acceleration inwards
n=3: hyper acceleration outwards
n=4: acceleration outwards
n=5: hyper deceleration outwards
n=6: hyper deceleration inwards
n=7: deceleration inwards.

The phase detector 73 also generates the following state vector $$S_D = \begin{cases} X_{v=0} = x'(t)+x_{off}(t) & \text{if } v(t)=0 \\ X_{a=0} = x'(t)+x_{off}(t) & \text{if } a(t)=0 \\ V_{a=0} = v(t) & \text{if } a(t)=0 \\ A_{v=0} = a(t) & \text{if } v(t)=0 \end{cases} \tag{38}$$

which describes the position, velocity and acceleration of the coil at zero crossing.

A predictor 71 provided with phase number n(t), vector D and with state vector $S_D$ anticipates the peak value $x_{peak}(t)$ of the voice coil movement by using a particular nonlinear model for each phase. For example, the first two phases are described by a steady state model giving $$x_{peak}(t) = \sqrt{\left(\frac{v(t)}{V_{a=0}}(X_{v=0}-X_{a=0})\right)^2 + (x'(t)+x_{off}(t))^2} \quad \text{if } n=1 \tag{39}$$

and $$x_{peak}(t) = \sqrt{\left(\frac{a(t)}{A_{v=0}}X_{a=0}\right)^2 + (X_{a=0}-(x'(t)-x_{off}(t)))^2} \quad \text{if } n=2 \tag{40}$$

using the variables in D and $S_D$,

The phases n=3-7 describe the transient processes where the sum of potential and kinetic energy is increased (3≤n≤6) or is reduced (n=6). The peak value can be estimated by the following approximations $$x_{peak}(t)=|x'(t)+x_{off}(t)-X_{v=0}|^{\beta_n}+|x'(t)+x_{off}(t)| \text{ if } n=3, \ldots ,5 \tag{41}$$

$$x_{peak}(t)=|x'(t)+x_{off}(t)-X_{v=0}|^{\beta_n}+|X_{v=0}| \text{ if } n=6 \tag{42}$$

$$x_{peak}(t)=|X_{v=0}|-|x'(t)+x_{off}(t)-X_{v=0}|^{\beta_n} \text{ if } n=7 \tag{43}$$

using a parameter $\beta_n$.

A comparator 72 compares the predicted peak value $x_{peak}(t)$ with a permissible threshold $x_{lim}$ and generates the control signal $C_x(t)$ supplied to the transfer element 65. Under the condition $|x_{peak}(t)|>|x_{lim}|$ an attenuator 74 or a high-pass with varying cut-off frequency is activated and attenuates the input signal z(t) in time to avoid an overshoot over the permissible limit $x_{lim}$ and the generation of audible artifacts.

Figure 9:
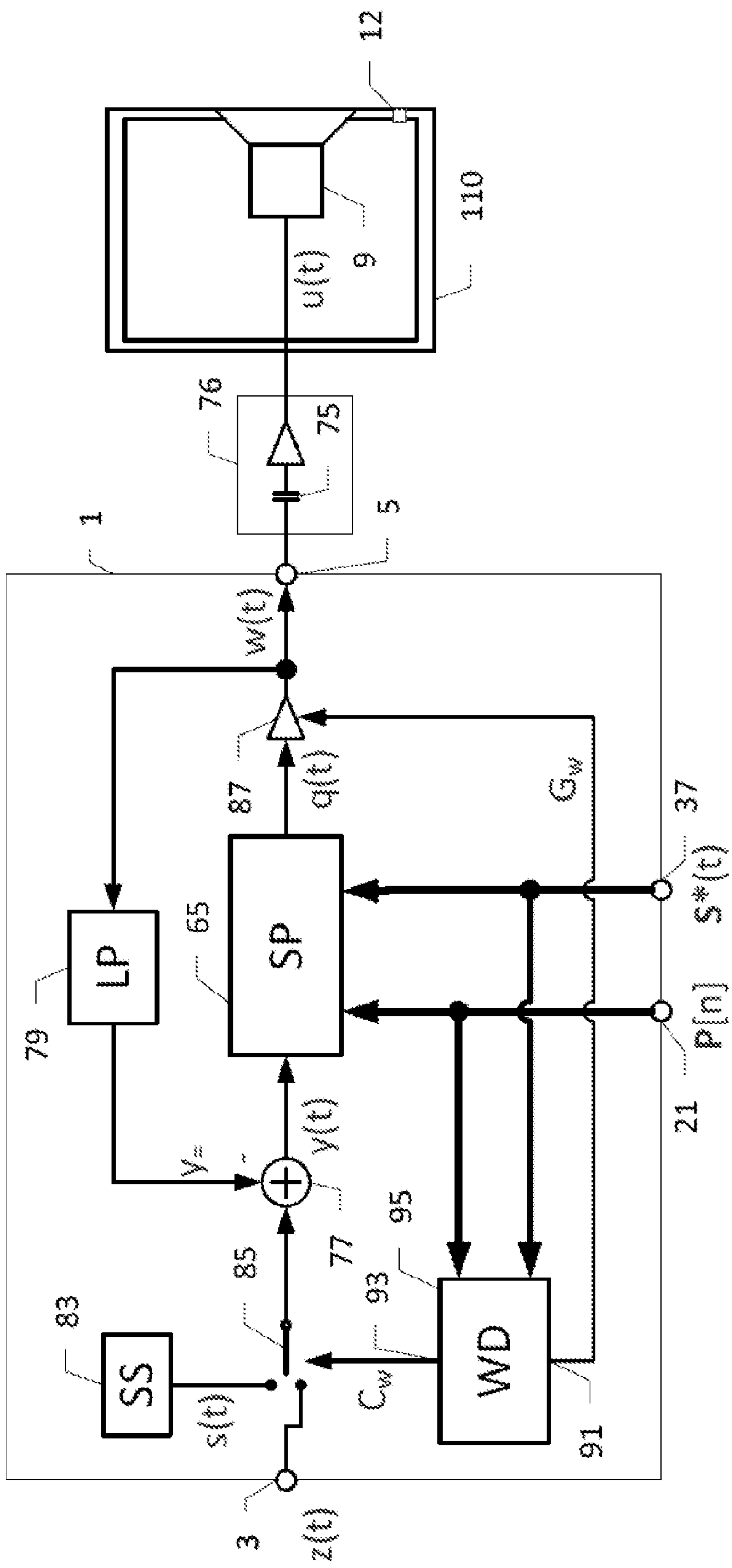
FIG. 9 shows an embodiment of the controller using a power amplifier with high-pass filter and automatic detection of the working range.

FIG. 9 shows an embodiment of controllers 1 in accordance with the invention, where the control output signal w(t) is supplied via a power amplifier 76 having a high-pass characteristic to the transducer 9. The high-pass filter 75 at the input of the amplifier blocks the dc and attenuates other low frequency components in the output signal w(t) generated by the nonlinear transfer element 65. In order to cope with the high-pass characteristic of the amplifier a modified input signal $y(t)=z(t)-y_{=}$ is supplied to the nonlinear transfer element 65, which reduces the low frequency components in the control output signal w(t). The compensation signal $y_{=}$ can be generated by supplying w(t) to a low-pass filter 79 having a cut-off frequency corresponding to the cut-frequency of the power amplifier. Alternatively the low-pass be located in the detector and the low-frequency signal $y_{=}$ can be supplied in the time variant property vector S*(t) to the subtractor 77 in the controller 1.

Controller 1 also contains a gain controller 95 that determines the maximal working range of the particular transducer 9. The gain controller 95 checks the validity of parameter vector P at parameter input 21 and activates or reactivates an initial learning procedure if there are no valid data in parameter vector P or the error signal e(t) exceeds a permissible limit $|e(t)|>e_{lim}$. The error signal is generated in error generator 23 and permanently supplied via time variant property vector S*(t) to controller 1 as shown in FIG. 4-6.

At the beginning of the initial identification the gain controller 95 generates a gain control gain $G_w$ at output 91 that reduces the gain of a compensation amplifier 87 provided with output signal q(t) from transfer element 65 and generating the control output $w(t)=G_w q(t)$. During the initial identification the transducer 9 is safely operated in the small signal domain to prevent an overload and damage of the transducer 9. The parameter $R_e(t=0)$ identified during start-up describes the voice coil resistance at ambient temperature and is used as a reference value in Eq. (22). The activator 41 actives the learning process of parameter vector P in the adaptive parameter estimator 27 in FIG. 6 if there is a persistent excitation of the transducer 9 and gain controller 95 increases slowly the control gain $G_w$ until the nonlinear parameters $b_i$ and $k_i$ or the increase of the voice coil resistance $R_e$ in parameter vector P indicate the limits of the permissible working range. The gain controller 95 also generates a control signal $C_w$ at output 93 supplied to the changeover switch 85 that selects the persistent excitation signal s(t) generated by signal source 83 during the initial identification and selects the external signal z(t) as the control input after completing the initial identification at time $t_1$.

The gain $G_v(t)$ of power amplifier 76 identified by permanent estimator 20 is also transferred in the time variant property vector S*(t) via input 37 to the gain controller 95. The control gain $G_w(t_1)$, gain $G_v(t_1)$ and the parameter vector $P(t_1)$ are stored in the controller at time $t_1$ and used as starting value when the control is resumed after power-down.

After the initial identification ($t>t_1$) the gain controller 95 generates the control gain $G_w(t)$ of the compensation amplifier 87 by the relationship $$G_w(t) = G_w(t_1)\frac{G_v(t_1)}{G_v(t)} \tag{44}$$

to compensate variation of the gain $G_v(t)$ of the power amplifier 76 and to generate a constant total transfer gain between signal q(t) at the output of transfer element 65 and voltage at the terminals of the transducer 9.

The transducer 9 is mounted in an almost sealed enclosure 110 with a small leakage 12 for static air pressure adjustment to generate a time constant required for stabilizing the voice coil position.

Further Embodiments

1. Arrangement for converting an input signal (z(t)) into a mechanical or acoustical output signal (p(t)) comprising a transducer (9), a controller (1), a detector (11) and a measurement device (13); said controller (1) receiving said input signal (z(t)) and generating a control output signal (w(t)) supplied to said transducer (9); said measurement device (13) providing at least one sensing signal (i(t)) comprising a state variable of said transducer (9), said detector (11) receiving said at least one sensing signal (i(t)) from the measurement device (13), wherein said detector (11) has a parameter output (15) generating based on the sensing signal (i(t)) a parameter vector (P[n]), the parameter vector (P[n]) describing the properties of said transducer (9) during such a moment (n), when the instantaneous properties of said control output signal (w(t)) provide persistent excitation of said transducer (9); said detector (11) has a property output (35) generating based on the sensing signal (i(t)) permanently a time variant property vector (S*(t)), describing the instantaneous properties of said transducer (9) for arbitrary properties of said control output signal (w(t)); and said controller (1) has a parameter input (21) provided with said parameter vector (P[n]) from said parameter output (15) and has a property input (37) provided with said time variant property vector (S*(t)) from said property output (35), wherein based on said parameter vector and said variant property vector said controller (1) is configured to generate a predefined transfer behavior between said input signal (z(t)) and said output signal (p(t)) and/or a control output signal for stabilizing the vibration of said transducer (9) and/or a control output signal for protecting said transducer (9) against overload.

2. Arrangement according to any of the preceding embodiments, wherein said parameter vector (P[n]) comprises at least one first parameter; said detector (11) contains at least one of: a model device (25), having a parameter input receiving said parameter vector (P[n]), a second input receiving said time variant property vector (S*(t)) and an output generating a predicted state signal (i'(t)) of said transducer (9); wherein said detector (11) further comprising an error generator (23), provided with said predicted state signal (i'(t)) at the output of said model device (25) and with said sensing signal (i(t)) from the measurement device (13), and generating an error signal (e(t)), which describes the deviation between the predicted state signal (i'(t)) and the sensing signal (i(t)); an activator (41), that analyses the properties of the control output signal (w(t)), and generates an activation signal (μ(t)) indicating the moment when said control output signal (w(t)) provides persistent excitation of said transducer (9); a parameter estimator (27), having an input provided with said error signal (e(t)), a control input (47) receiving said activation signal from that activator (41) which activates the generation of a unique and optimal estimate of the first parameter by minimizing the error signal (e(t)); a permanent estimator (49), generating permanently an update of said time variant property vector (S*(t)) supplied to said property output (35) by minimizing the error signal (e(t)).

3. Arrangement according to embodiment 2, wherein said activator (41) has an input provided with said parameter vector (P[n]), wherein said activator (41) is further configured to: generate a value describing the temporal variance of each parameter in said parameter vector (P[n]); and to generate said activation signal (μ(t)) which deactivates the updating of a parameter having the lowest value of the temporal variance while activating the updating of other parameters having a higher variance.

4. Arrangement according to embodiment 2 or 3, wherein said activator (41) is provided with the error signal (e(t)) from the error generator (23) or with the parameter vector (P[n]) from said parameter estimator (27), wherein said activator (41) is further configured to: generate an importance value, that describes the contribution of each parameter to the modeling of transducer (9); and to generate said activation signal (μ(t)) which deactivates the estimation of a parameter having an importance value that is below a threshold value.

5. Arrangement according to any of the preceding embodiments, wherein said time variant property vector (S*(t)) comprises at least one information of: an instantaneous offset (xoff(t)) of the position of a mechanical vibration element of the transducer (9) and/or an instantaneous stiffness variation (kv(t)) of the mechanical suspension of the transducer (9) and/or an instantaneous resistance variation (rv(t)) of the transducer and/or any other time varying parameters of said transducer (9) or a power amplifier (7), wherein said time varying parameters contain only low frequency components which are not supplied by the control output signal (w(t)).

6. Arrangement according to any of the preceding embodiments, wherein said controller (1) contains an offset compensator (33, 31), having a first input provided with said offset (xoff(t)), a second input provided with said input signal (z(t)), and an output generating an offset compensated signal (a(t)); wherein said offset compensator (33, 31) is configured to generate an additional low frequency component in the offset compensated signal (a(t)) which compensates for said offset (xoff(t)); and said controller (1) contains a transfer element (65), having a first input provided with said offset compensated signal (a(t)) from the output of said offset compensator (33, 31), and having an output generating said control output signal (w(t)); wherein said transfer element (65) has a transfer characteristic between its first input and its output which depends on the time variant property vector (S*(t)) and said parameter vector (P [n]).

7. Arrangement according to any of the preceding embodiments, wherein said controller (1) contains a transfer element (65) generating the control output signal (w(t)) wherein said control output signal (w(t)) comprises low frequency components; further comprising a power amplifier (7) arranged between the controller (1) and the transducer (9) and configured to generate an amplified control output signal (u(t)) for the transducer (9); further comprising a high-pass filter (75) which is configured to attenuate low frequency components of the control output signal (w(t)) and/or the amplified control output signal (u(t)); and said controller (1) contains a compensator (79, 77), having a first input provided with said input signal (z(t)), having a second input provided with said control output signal (w(t)), and an output generating a compensated signal (y(t)) supplied to the input of said transfer element (65); wherein said compensator (79, 77) is configured to generate additional low frequency components in the compensated signal (y(t)) which reduce the low frequency components in the control output signal (w(t)).

8. Arrangement according to embodiment 7, wherein said compensator (79, 77) comprises: a low-pass filter (79), having an input provided with said control output signal (w(t)) and having an output generating a low-frequency signal (y=(t)) based on said control output signal (w(t)); and a subtracter (77) generating said compensated signal (y(t)) by calculating a difference between said input signal (z(t)) and said low-frequency signal (y=(t)).

9. Arrangement according to any of the preceding embodiments, wherein said controller (1) contains a gain controller (95), having an input provided with said parameter vector (P[n]) from said parameter input (21) and an output (91) generating a control gain (Gw) which depends on the validity of said parameter vector (P[n]); said controller (1) contains a transfer element (65), having an input provided with said input signal (z(t)) and an output, wherein said parameter vector (P[n]) determines the transfer behavior between the input and the output of the transfer element (65); and said controller (1) contains a compensation amplifier (87), connected with the output of said transfer element (65), generating said control output signal (w(t)), and having a control input provided with said control gain (Gw) from the output (91) of said gain controller (95); wherein said compensation amplifier (87) generates an attenuated control output signal if at least one parameter of said parameter vector (P[n]) is invalid.

10. Arrangement according to any of the preceding embodiments, wherein said controller (1) contains a signal source (83), having an output generating an internal signal (s(t)); said controller (1) contains a changeover switch (85), having a first input provided with the internal signal from the output of said signal source (83), a second input provided with said input signal (z(t)), a control input and an output connected to the input of said transfer element (65); and said gain controller (95) has an output (93) generating a control signal (Cw) supplied to the control input of said changeover switch (85); wherein said gain controller (95) is configured to select the internal signal (s(t)) from said signal source (83) if at least one parameter of said parameter vector (P[n]) is invalid, and to select the input signal (z(t)) if all parameters of said parameter vector are valid.

11. Arrangement according to any of the preceding embodiments, wherein said controller (1) contains a transfer element (65), having an input provided with said input signal (z(t)), and an output generating a control signal (q(t)); said controller (1) contains a power amplifier (7) arranged between the controller (1) and the transducer (9) and configured to amplify the control output signal (w(t)) by a time-variant amplifier gain (Gv(t)) and to generate the amplified control output signal (u(t)) for the transducer (9); and said controller (1) contains a compensation amplifier (87), generating the control output signal (w(t)) by scaling the control signal (q(t)) by a control gain (Gw), wherein the compensation amplifier (87) is configured to compensate the variation of said time-variant amplifier gain (Gv(t)) to ensure a constant overall gain between the output of said transfer element (65) and the input of said transducer (9).

12. Arrangement according to embodiment 11, wherein said detector (11) has an input (10) provided with said control output signal (w(t)) from the output (5) of said controller (1), wherein said detector (11) is configured to determine the amplifier gain (Gv(t)); and said controller (1) or detector (11) contain a gain controller (95), having an input provided with said amplifier gain (Gv(t)) and a control output (91) generating said control gain (Gw) which is inverse to the amplifier gain (Gv(t)).

13. Arrangement according to any of the preceding embodiments, wherein said controller (1) or detector (11) contain a power estimator (53; 63), having an output generating a value that describes instantaneous electric input power (Pe'(t)) supplied to the transducer (9); said controller (1) or detector (11) contain a resistance predictor (55; 62), wherein said resistance predictor (55; 62) is configured to generate a predicted value (Re,p(t)) of the dc-resistance based on said input power from the output of said power estimator (53; 63) and an updated estimate of the dc-resistance (Re) provided in said parameter vector (P[n]), wherein said dc-resistance is used for modeling the electrical input impedance of said transducer (9); said controller (1) contains a comparator (59), wherein said comparator (59) is configured to generate a control signal (Ct(t)) by comparing said predicted value (Re,p(t)) with a permissible limit value (Rlim); and said controller (1) contains a transfer element (65), generating said control output signal (w(t)) based on said input signal (z(t)) and the control signal (Ct(t)), wherein the control signal (Ct(t)) attenuates the amplitude of said control output signal (w(t)) and prevents a thermal overloading of said transducer (9) if the predicted value (Re,p(t)) exceeds permissible limit value (Rlim).

14. Arrangement according to embodiment 13, wherein said controller (1) or detector (11) contain an integrator (64), provided with said predicted value (Re,p(t)) from the output of said resistance predictor (55; 62), and generating an instantaneous dc-resistance (Re,i(t)), wherein said integrator (64) has a time constant that corresponds to the thermal time constant of said transducer (9).

15. Arrangement according to any of the preceding embodiments, wherein said controller (1) contains at least one of: a model device (67) which is configured to generate instantaneous position information (x'+xoff) of a mechanical vibration element of said transducer (9) based on said input signal (z(t)) or said control output signal (w(t)), said parameter vector (P[n]), said time variant property vector (S*(t)); a differentiator (69), provided with the position information of the mechanical vibration element and generating a velocity information and a higher-order derivative information of the mechanical vibration element based on the provided position information; a predictor (71), having an output generating a predicted peak value (xpeak(t)) of the position of said mechanical vibration element based on the instantaneous position information of the mechanical vibration element, the velocity information and the higher-order derivative information; a comparator (72), generating a control signal (Cx(t)) based on said predicted peak value (xpeak(t)) from the output of said predictor (71), wherein said control signal (Cx(t)) indicates an anticipated mechanic overloading of said transducer when said predicted peak value (xpeak(t)) exceeds a permissible threshold value (xlim); and a transfer element (65), provided with said input signal (z(t)) and the control signal (Cx(t)), and generating said control output signal (w(t)) based on said input signal (z(t)) and said control signal (Cx(t)), wherein said control signal (Cx(t)) is configured to change the transfer behavior of said transfer element (65) and to attenuate signal components in the control output signal (w(t)) such to prevent a mechanical overload of said transducer (9).

16. Arrangement according to embodiment 15, wherein said predictor contains a phase detector (73), which is configured to segment the movement of the mechanical vibration element into a series of moving phases, wherein at least one phase of the series of moving phases describes the acceleration and at least one further phase of the series of moving phases describes the deceleration of the mechanical vibration element; and said predictor (71) is configured to generate a predicted peak value (xpeak(t)) by using a non-linear model considering properties of each phase of the series of moving phases.

17. Method for converting an electrical input signal (z(t)) into a mechanical and/or acoustical output signal (p(t)), the method comprising: providing an input for receiving an input signal (z(t)) and a transducer (9) for outputting a mechanical and/or acoustical output signal (p(t)); providing an initial parameter vector (P[n]) and an initial time variant property vector (S*(t)); generating a control output signal (w(t)) based on the received input signal (z(t)), the parameter vector (P[n]) and the time variant property vector (S*(t)); operating the transducer (9) with the control output signal (w(t)) in order to generate a predefined transfer behavior between said input signal (z(t)) and said output signal (p(t)) and/or to stabilize the vibration of said transducer (9) and/or to protect said transducer (9) against overload; generating sensed information of state of the transducer (9) operated with the control output signal (w(t)); based on the sensed information of the state of the transducer (9), generating an update of said parameter vector (P[n]) describing the properties of the transducer at a moment when said control output signal (w(t)) provides persistent excitation of the transducer (9); and based on the sensed information of the state of the transducer (9), generating permanently an update of said time variant property vector (S*(t)) describing the instantaneous properties of the transducer (9) excited by said control output signal (w(t)) having arbitrary signal properties.

18. Method according to any of the preceding method embodiments, wherein generating an update of said parameter vector (P[n]) comprises: modeling the behavior of the transducer (9) by using at least one parameter in the parameter vector (P[n]); generating an error signal, which describes the deviation between the result of the modeled operation of the transducer (9) and the actual operation of the transducer (9); generating an instantaneous activation signal (40) for each single parameter in said parameter vector (P[n]) based on the instantaneous properties of the control signal (w(t)); and generating a unique and optimal estimate of the parameter by minimizing the error signal if the activation signal indicates persistent excitation of said transducer (9) by the control output signal (w(t)).

19. Method according to any of the preceding method embodiments, wherein the generating the time variant property vector (S*(t)) comprises: modeling the behavior of the transducer (9) by using at least one parameter in said time variant property vector (S*(t)) which contains only low frequency components which are not supplied by the input signal (z(t)); generating an error signal, which describes the deviation between the result of the modelled operation of the transducer (9) and the actual operation of the transducer (9); generating permanently an optimal estimate of the parameter in said time variant property vector by minimizing the error signal.

20. Method according to embodiment 18, wherein the generating an instantaneous activation signal comprises: generating a gradient signal for each parameter in the parameter vector (P[n]), wherein said gradient signal is the partial derivative of the error signal with respect to the parameter; generating a correlation matrix comprising at least one correlation value between two gradient signals of parameters which are activated by said activation signal; determining the rank of the correlation matrix; assessing the time variance of each parameter in the parameter vector; and generating an activation signal that activates the update of each parameter considered in the correlation matrix if the correlation matrix has full rank and deactivates the update of a parameter in the parameter vector that has the lowest time variance if the correlation matrix has a rank loss.

21. Method according to any of the preceding method embodiments, wherein the generating a control output signal (w(t)) comprises: generating a time variant parameter describing the offset (xoff(t)) of a mechanical vibration element of the transducer; generating a compensation signal (zoff(t)) based on the offset provided in the time variant property vector (S*(t)); generating a sum signal (a(t)) by adding said compensation signal to said input signal (z(t)); and generating the control output signal (w(t)) based on the sum signal.

22. Arrangement or method according to embodiments 6 or 21, wherein said transducer (9) is a loudspeaker operated in a sealed enclosure (10), having a small leak (12) to compensate for variation of the static air pressure; wherein said volume of the enclosure (10) and/or said size of the leak (12) is configured such to define a time constant, which is larger than the duration required for the generation of said offset (xoff(t)) and the compensation signal (zoff(t)).

23. Method according to any of the preceding method embodiments, wherein the generating a control output signal (w(t)) comprises: providing a compensation signal (y=); generating a compensated input signal (y(t)) based on the input signal (z(t)) and the compensation signal (y=); generating the control output signal (w(t)) based on said compensated input signal (y(t)); generating a high-pass filtered control signal (u(t)) by attenuating signal components in the control output signal (w(t)) below a cut-off frequency; supplying said high-pass filtered control signal (u(t)) to the terminals of said transducer (9).

24. Method according to embodiment 23, wherein the generating a compensated input signal (y(t)) comprises: generating a compensation signal (y=) by low-pass filtering of the control output signal (w(t)); and generating said compensated signal (y(t)) by subtracting said compensation signal (y=) from said input signal (z(t)).

25. Method according to any of the preceding method embodiments, wherein the generating a control output signal (w(t)) comprises: checking the validity of the parameters of the parameter vector (P[n]); decreasing a control gain (Gw) if at least one parameter in the parameter vector is invalid; increasing said control gain (Gw) if said update of the parameter vector (P[n]) does not indicate overloading of said transducer; generating a processed signal (q(t)) by linear or nonlinear processing of said input signal (z(t)); and generating said control output signal (w(t)) by scaling said processed signal (q(t)) with said control gain (Gw).

26. Method according to any of the preceding method embodiments, wherein the generating a control output signal (w(t)) comprises: identifying the instantaneous gain (Gv(t)) of a power amplifier (7) by using the sensed state of the transducer (9) and the control output signal (w(t)), converting by the power amplifier (7) the control output signal (w(t)) into an amplified control output signal (u(t)) which is then supplied to the transducer (9); generating a control gain (Gw) by using the instantaneous gain (Gv(t)) to compensate for variation of said instantaneous gain (Gv(t)) and to generate a constant transfer function between the control output signal (w(t)) and the amplified control output signal (u(t)); generating a processed signal (q(t)) based on said input signal (z(t)); and generating said control output signal (w(t)) by scaling said processed signal (q(t)) with the generated control gain (Gw).

27. Method according to embodiment 18, wherein the generating an instantaneous activation signal (μ(t)) comprises: generating an importance value for each parameter in parameter vector (P[n]), wherein said importance value describes the contribution of the corresponding parameter to the modeling of said transducer; and deactivating the estimation of said parameter if the importance value of this parameter is below a predefined threshold.

28. Method according to embodiment 27, wherein the generating an importance value comprises: generating a total cost function (C) which describes the deviation between the result of the modeling and the behavior of said transducer while all parameters in the parameter vector (P[n]) are used in the modeling; generating a partial cost function which describes the deviation between the result of the modeling and the behavior of said transducer while setting one parameter to zero and using all remaining parameters in the parameter vector (P[n]); and generating the importance value by using the partial cost function and total cost function (C).

29. Method according to embodiment 27, wherein the generating an importance value comprises: generating a gradient signal for at least one parameter in parameter vector (P[n]), wherein said gradient signal is the partial derivative of the error signal with respect to the corresponding parameter; calculating an expectation value of the squared gradient signal; and generating said importance value by using said expectation value of the squared gradient signal and said parameter.

30. Method according to any of the preceding method embodiments, wherein the generating a control output signal (w(t)) comprises: generating a value of the instantaneous electric input power (Pe'(t)) supplied to said transducer (9) based on the control output signal (w(t)) or sensed information of the state of the transducer (9); updating a resistance parameter (Re) describing the time varying dc-resistance at the electric terminals of said transducer (9) based on the sensed state of the transducer (9) to consider the influence of varying ambient condition; estimating a predicted value (Re,p(t)) of the time variant dc-resistance by using the instantaneous electric input power (Pe'(t)) and the resistance parameter (Re) in the parameter vector (P[n]); comparing said predicted value (Re,p(t)) with a predefined limit value (Rlim) and generating a control signal (Ct(t)) which indicates an anticipated thermal overloading of said transducer (9); generating the control output signal (w(t)) from said control input signal (z(t)) by using said control signal (Ct(t))

to reduce the amplitude of the control output signal (w(t)) in time and to prevent a thermal overloading.

31. Method according to embodiment 30, wherein the generating a control output signal (w(t)) comprises: generating an instantaneous value (Re,i(t)) by integrating the predicted value (Re,p(t)) with a time constant corresponding to the thermal time constant of said transducer (9); generating a predefined transfer behavior between the input signal (z(t)) and the output signal (p(t)) of said transducer (9) by compensating the temporal variation of said instantaneous dc-resistance (Re,i(t)).

32. Method according to any of the preceding method embodiments, wherein the generating a control output signal (w(t)) comprises: estimating a predicted peak value (xpeak (t)) of the position (x'+xoff) of the mechanical vibration element of the transducer (9) based on the parameter vector P[n] and the time variant property vector S*(t); generating a control signal (Cx(t)) by comparing said predicted peak value (xpeak(t)) with a permissible limit value (xlim) which anticipates a mechanical overloading of said transducer (9); and attenuating low frequency components in the control input signal (z(t)) by using said control signal (Cx(t)) in order to prevent a mechanical overloading and in order to keep the position (x'+xoff) of the mechanical vibration element of the transducer (9) below said permissible limit value.

33. Method according to embodiment 32, wherein the estimating an predicted peak value (xpeak(t)) comprises: generating an instantaneous parameter (xoff(t)) in the time variant property vector (S*(t)) which describes the offset of the mechanical vibration element of the transducer (9); generating the instantaneous position information (x'+xoff) of the mechanical vibration element of the transducer (9) by using the input signal (z(t)), the parameter vector P[n] and the time variant property vector S*(t); generating velocity information of the mechanical vibration element of the transducer (9) and a higher-order derivative information of the position information (x'+xoff); segmenting the movement of said mechanical vibration element into multiple phases, wherein at least one phase of the multiple phases describes the acceleration of the mechanical vibration element and at least one further phase of the multiple phases describes the deceleration of the mechanical vibration element; and estimating the predicted peak value (xpeak(t)) by using a nonlinear model considering the properties of each phase.

Advantages of the Invention

The invention reduces the size, weight and cost of loudspeaker, headphones and other audio reproduction systems by using digital signal processing for exploiting the material resources of the electro-mechanical transducer. The identification and control system is simple to use and requires no a priori information on the hardware components (transducer, amplifier). The output signal is generated at the amplitude and quality required for the particular application over the life time of the transducer while compensating for aging, fatigue, climate, user interaction and other unpredictable influences.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different circuitry components. For example, the exemplary topology in the figures and the discussion thereof is presented merely to provide a useful reference in discussing various aspects of the invention. Of course, the description of the topology has been simplified for purposes of discussion, and it is just one of many different types of appropriate topologies that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

In the claims, any reference signs placed between parentheses shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried, unless specifically recited in the claim.

Skilled artisans will appreciate that elements in the figures are illustrated for simplicity and clarity and have not necessarily drawn to scale. For example, the chosen elements are only used to help to improve the understanding of the functionality and the arrangements of these elements in various embodiments of the present invention. Also, common but well understood elements that are useful or necessary in a commercial feasible embodiment are mostly not depicted in order to facilitate a less abstracted view of these various embodiments of the present invention. It will further be appreciated that certain actions and/or steps in the described method may be described or depicted in a particular order of occurrences while those skilled in the art will understand that such specificity with respect to sequence is not actually required. It will also be understood that the terms and expressions used in the present specification have the ordinary meaning as it accorded to such terms and expressions with respect to their corresponding respective areas of inquiry and study except where specific meanings have otherwise be set forth herein. In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different circuitry components. For example, the exemplary topology in the figures and the discussion thereof is presented merely to provide a useful reference in discussing various aspects of the invention. Of course, the description of the topology has been simplified for purposes of discussion, and it is just one of many different types of appropriate topologies that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device.

In the claims, any reference signs placed between parentheses shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, Willis such as "first" and "second" are used to arbitrarily distinguish between the elements such terms describe. Thus, these tennis are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried, unless specifically recited in the claim.

Skilled artisans will appreciate that elements in the figures are illustrated for simplicity and clarity and have not necessarily drawn to scale. For example, the chosen elements are only used to help to improve the understanding of the functionality and the arrangements of these elements in various embodiments of the present invention. Also, common but well understood elements that are useful or necessary in a commercial feasible embodiment are mostly not depicted in order to facilitate a less abstracted view of these various embodiments of the present invention. It will further be appreciated that certain actions and/or steps in the described method may be described or depicted in a particular order of occurrences while those skilled in the art will understand that such specificity with respect to sequence is not actually required. It will also be understood that the terms and expressions used in the present specification have the ordinary meaning as it accorded to such terms and expressions with respect to their corresponding respective areas of inquiry and study except where specific meanings have otherwise be set forth herein.

The invention claimed is:

1. An arrangement for converting an input signal into a mechanical or acoustical output signal comprising a transducer, a controller, a detector and a measurement device; said controller receiving said input signal and generating a control output signal supplied to said transducer; said measurement device providing at least one sensing signal comprising a state variable of said transducer, said detector receiving said at least one sensing signal from the measurement device, wherein said detector has a parameter output generating based on the sensing signal a parameter vector, the parameter vector describing the properties of said transducer during such a moment, when the instantaneous properties of said control output signal provide persistent excitation of said transducer;

said detector has a property output generating based on the sensing signal permanently a time variant property vector, describing time variant properties of said transducer for arbitrary properties of said control output signal, wherein said time variant property vector contains only low frequency components which are not supplied by the control output signal, said time variant property vector further comprises a characteristic describing an instantaneous offset of a rest position of a mechanical vibration element of the transducer, wherein all displacement depending nonlinearities in a lumped parameter model of said transducer depend on said instantaneous offset; and said controller has a parameter input provided with said parameter vector from said parameter output and has a property input provided with said time variant property vector from said property output, wherein said variant property vector including the characteristic describing the instantaneous offset compensates for a discrepancy between said transducer and said lumped parameter model to generate a predefined transfer behavior between said input signal and said output signal or a control output signal for stabilizing the vibration of said transducer or a control output signal for protecting said transducer against overload.

2. The arrangement according to claim 1, wherein said parameter vector comprises a first parameter;

said detector contains at least one of:

a model device, having a parameter input receiving said parameter vector, a second input receiving said time variant property vector and an output generating a predicted state signal of said transducer; wherein said detector further comprising an error generator, provided with said predicted state signal at the output of said model device and with said sensing signal from the measurement device, and generating an error signal, which describes the deviation between the predicted state signal and the sensing signal;

an activator, that analyses the properties of the control output signal, and generates an activation signal indicating the moment when said control output signal provides persistent excitation of said transducer, wherein said persistent excitation is usable to assess the influence of said first parameter on said error signal;

a parameter estimator, having an input provided with said error signal, a control input receiving said activation signal from that activator which activates the generation of a unique and optimal estimate of the first parameter by minimizing the error signal;

a permanent estimator, generating permanently an update of said time variant property vector supplied to said property output by minimizing the error signal.

3. The arrangement according to claim 2, wherein said activator has an input provided with said parameter vector, wherein said activator is further configured to:

generate a value describing the temporal variance of each parameter in said parameter vector; and to generate said activation signal which deactivates the updating of a parameter having the lowest value of the temporal variance while activating the updating of other parameters having a higher variance.

4. The arrangement according to claim 2, wherein said activator is provided with the error signal from the error generator or with the parameter vector from said parameter estimator, wherein said activator is further configured to:

generate an importance value, that describes the contribution of said first parameter in said parameter vector to a reduction of a cost function assessing said error signal; and to generate said activation signal which deactivates the estimation of said first parameter having an importance value that is below a threshold value.

5. The arrangement according to claim 1, wherein said time variant property vector further comprises at least one information of:

an instantaneous stiffness variation of the mechanical suspension at the rest position of said mechanical vibration element of the transducer or an instantaneous resistance variation of the transducer or a time variant characteristic used in the modeling of said transducer or a power amplifier, wherein said characteristic contains only low frequency components which are not supplied by the control output signal (w(t)); and said characteristic is incoherent with the input signal.

6. The arrangement according to claim 1, wherein said controller contains an offset compensator, having a first input provided with said time variant property vector describing said instantaneous offset of the mechanical vibration element, a second input provided with said input signal, and an output generating an offset compensated signal; wherein said offset compensator is configured to generate an additional low frequency component in the offset compensated signal which compensates for said instantaneous offset; and said controller contains a transfer element, having a first input provided with said offset compensated signal from the output of said offset compensator, and having an output generating said control output signal; wherein said transfer element has a transfer characteristic between its first input and its output which depends on the time variant property vector and said parameter vector.

7. The arrangement according to claim 6, wherein said transducer is a loudspeaker operated in a sealed enclosure, having a small leak to compensate for variation of the static air pressure; wherein said volume of the enclosure or said size of the leak is configured such to define a time constant, which is larger than the duration required for the generation of said instantaneous offset and the compensation signal.

8. The arrangement according to claim 1, wherein said controller contains a transfer element generating the control output signal wherein said control output signal comprises low frequency components;

further comprising a power amplifier arranged between the controller and the transducer and configured to generate an amplified control output signal for the transducer;

further comprising a high-pass filter which is configured to attenuate low frequency components of the control output signal or the amplified control output signal; and said controller contains a compensator, having a first input provided with said input signal, having a second input provided with said control output signal, and an output generating a compensated signal supplied to the input of said transfer element; wherein said compensator is configured to generate additional low frequency components in the compensated signal which reduce the low frequency components in the control output signal.

9. The arrangement according to claim 8, wherein said compensator comprises:

a low-pass filter, having an input provided with said control output signal and having an output generating a low-frequency signal based on said control output signal; and a subtracter generating said compensated signal by calculating a difference between said input signal and said low-frequency signal.

10. The arrangement according to claim 1, wherein said controller contains a gain controller, having an input provided with said parameter vector from said parameter input and an output generating a control gain which depends on the validity of said parameter vector;

said controller contains a transfer element, having an input provided with said input signal and an output, wherein said parameter vector determines the transfer behavior between the input and the output of the transfer element; and said controller contains a compensation amplifier, connected with the output of said transfer element, generating said control output signal, and having a control input provided with said control gain from the output of said gain controller; wherein said compensation amplifier generates an attenuated control output signal if at least one parameter of said parameter vector is invalid.

11. The arrangement according to claim 10, wherein said controller contains a signal source, having an output generating an internal signal;

said controller contains a changeover switch, having a first input provided with the internal signal from the output of said signal source, a second input provided with said input signal, a control input and an output connected to the input of said transfer element; and said gain controller has an output generating a control signal supplied to the control input of said changeover switch; wherein said gain controller is configured to:

select the internal signal from said signal source if at least one parameter of said parameter vector is invalid, and select the input signal if all parameters of said parameter vector are valid.

12. The arrangement according to claim 10, wherein said controller contains a transfer element, having an input provided with said input signal, and an output generating a control signal;

said controller contains a power amplifier arranged between the controller and the transducer and configured to amplify the control output signal by a time-variant amplifier gain and to generate the amplified control output signal for the transducer; and said controller contains a compensation amplifier, generating the control output signal by scaling the control signal by a control gain, wherein the compensation amplifier is configured to compensate the variation of said time-variant amplifier gain to ensure a constant overall gain between the output of said transfer element and the input of said transducer.

13. The arrangement according to claim 12, wherein said detector has an input provided with said control output signal from the output of said controller, wherein said detector is configured to determine the amplifier gain; and said controller or detector contain a gain controller, having an input provided with said amplifier gain and a control output generating said control gain which is inverse to the amplifier gain.

14. The arrangement according to claim 1, wherein said controller or detector contain a power estimator, having an output generating a value that describes instantaneous electric input power supplied to the transducer;

said controller or detector contain a resistance predictor, wherein said resistance predictor is configured to generate a predicted value of the dc-resistance based on said input power from the output of said power estimator and an updated estimate of the dc-resistance provided in said parameter vector, wherein said dc-resistance is used for modeling the electrical input impedance of said transducer;

said controller contains a comparator, wherein said comparator is configured to generate a control signal by comparing said predicted value with a permissible limit value; and said controller contains a transfer element, generating said control output signal based on said input signal and the control signal, wherein the control signal attenuates the amplitude of said control output signal and prevents a thermal overloading of said transducer if the predicted value exceeds permissible limit value.

15. The arrangement according to claim 14, wherein said controller or detector contain an integrator, provided with said predicted value from the output of said resistance predictor, and generating an instantaneous dc-resistance, wherein said integrator has a time constant that corresponds to the thermal time constant of said transducer.

16. The arrangement according to claim 1, wherein said controller contains at least one of:

a model device which is configured to generate instantaneous position information of said mechanical vibration element of said transducer based on said input signal or said control output signal, said parameter vector, said time variant property vector;

a differentiator, provided with the position information of the mechanical vibration element and generating a velocity information and a higher-order derivative information of the mechanical vibration element based on the provided position information;

a predictor, having an output generating a predicted peak value of the position of said mechanical vibration element based on the instantaneous position information of the mechanical vibration element, the velocity information and the higher-order derivative information;

a comparator, generating a control signal based on said predicted peak value from the output of said predictor, wherein said control signal indicates an anticipated mechanic overloading of said transducer when said predicted peak value exceeds a permissible threshold value; and a transfer element, provided with said input signal and the control signal, and generating said control output signal based on said input signal and said control signal, wherein said control signal is configured to change the transfer behavior of said transfer element and to attenuate signal components in the control output signal such to prevent a mechanical overload of said transducer.

17. The arrangement according to claim 16, wherein said predictor contains a phase detector, which is configured to segment the movement of the mechanical vibration element into a series of moving phases, wherein at least one phase of the series of moving phases describes the acceleration and at least one further phase of the series of moving phases describes the deceleration of the mechanical vibration element; and said predictor is configured to generate a predicted peak value by using a nonlinear model considering properties of each phase of the series of moving phases.

18. A method for converting an electrical input signal into a mechanical or acoustical output signal, the method comprising:

providing an input for receiving an input signal and a transducer for outputting said mechanical or acoustical output signal;

providing an initial parameter vector and an initial time variant property vector;

generating sensed information of a state of the transducer;

based on the sensed information of the state of the transducer, generating an update of said parameter vector describing the properties of the transducer at a moment when a control output signal provides persistent excitation of the transducer; and based on the sensed information of the state of the transducer, generating permanently an update of said time variant property vector describing the time variant instantaneous properties of the transducer excited by said control output signal having arbitrary signal properties, wherein said time variant property vector contains only low frequency components which are not supplied by the control output signal, said time variant property vector further comprising a characteristic describing an instantaneous offset of the rest position of a mechanical vibration element of the transducer; while all displacement depending nonlinearities inherent in a lumped parameter model of said transducer depend on said instantaneous offset;

generating said control output signal based on the received input signal, the parameter vector and the time variant property vector, wherein said variant property vector including the characteristic describing the instantaneous offset compensates for the discrepancy between said transducer and said lumped parameter model; and operating the transducer with the control output signal in order to generate a predefined transfer behavior between said input signal and said output signal or to stabilize the vibration of said transducer or to protect said transducer against overload.

19. The method according to claim 18, wherein generating an update of said parameter vector comprises:

modelling the behavior of the transducer by using a first parameter in the parameter vector;

generating an error signal, which describes the deviation between the result of the modelled operation of the transducer and the actual operation of the transducer;

generating an instantaneous activation signal for said first parameter in said parameter vector based on the instantaneous properties of the control signal; and generating a unique and optimal estimate of said first parameter by minimizing the error signal if the activation signal indicates persistent excitation of said transducer by the control output signal, wherein said persistent excitation is usable to assess the influence of said first parameter on said error signal.

20. The method according to claim 19, wherein the generating an instantaneous activation signal comprises:

generating an importance value for said first parameter in said parameter vector, wherein said importance value describes the contribution of said first parameter to reduction of said error signal assessing said modelling of said transducer; and deactivating the estimation of said first parameter if the importance value of this parameter is below a predefined threshold.

21. The method according to claim 20, wherein the generating of said importance value comprises:

generating a total cost function which describes the deviation between the result of the modeling and the behavior of said transducer while all parameters in the parameter vector are used in the modeling;

generating a partial cost function which describes the deviation between the result of the modeling and the behavior of said transducer while setting said first parameter to zero and using all remaining parameters in the parameter vector; and generating the importance value of said first parameter by assessing a difference between the partial cost function and said total cost function.

22. The method according to claim 20, wherein the generating said importance value comprises:

generating a gradient signal for said first parameter in parameter vector, wherein said gradient signal is the partial derivative of the error signal with respect to said first parameter;

calculating an expectation value of a squared gradient signal; and generating said importance value by multiplying said expectation value with a squared value of said first parameter.

23. The method according to claim 18, wherein the generating the time variant property vector comprises:

modeling the behavior of the transducer by using at least one parameter in said time variant property vector which contains only low frequency components which are not supplied by the input signal;

generating an error signal, which describes the deviation between the result of the modeled operation of the transducer and the actual operation of the transducer;

generating permanently an optimal estimate of the parameter in said time variant property vector by minimizing the error signal.

24. The method according to claim 18, wherein the generating an instantaneous activation signal comprises:

generating a gradient signal for each parameter in the parameter vector, wherein said gradient signal is the partial derivative of the error signal with respect to the parameter;

generating a correlation matrix comprising at least one correlation value between two gradient signals of parameters which are activated by said activation signal;

determining the rank of the correlation matrix;

assessing the time variance of each parameter in the parameter vector; and generating an activation signal that activates the update of each parameter considered in the correlation matrix if the correlation matrix has full rank and deactivates the update of a parameter in the parameter vector that has the lowest time variance if the correlation matrix has a rank loss.

25. The method according to claim 18, wherein the generating a control output signal comprises:

generating said characteristic in said time variant property vector describing the instantaneous offset of the mechanical vibration element of the transducer;

generating a compensation signal based on the instantaneous offset provided in the time variant property vector;

generating a sum signal by adding said compensation signal to said input signal; and generating the control output signal based on the sum signal.

26. The method according to claim 18, wherein the generating a control output signal comprises:

providing a compensation signal;

generating a compensated input signal based on the input signal and the compensation signal;

generating the control output signal based on said compensated input signal;

generating a high-pass filtered control signal by attenuating signal components in the control output signal below a cut-off frequency;

supplying said high-pass filtered control signal to the terminals of said transducer.

27. The method according to claim 26, wherein the generating a compensated input signal comprises:

generating a compensation signal by low-pass filtering of the control output signal; and generating said compensated signal by subtracting said compensation signal from said input signal.

28. The method according to claim 18, wherein the generating a control output signal comprises:

checking the validity of the parameters of the parameter vector;

decreasing a control gain if at least one parameter in the parameter vector is invalid;

increasing said control gain if said update of the parameter vector does not indicate overloading of said transducer;

generating a processed signal by linear or nonlinear processing of said input signal; and generating said control output signal by scaling said processed signal with said control gain.

29. The method according to claim 18, wherein the generating a control output signal comprises:

identifying the instantaneous gain of a power amplifier by using the sensed state of the transducer and the control output signal, converting by the power amplifier the control output signal into an amplified control output signal which is then supplied to the transducer;

generating a control gain by using the instantaneous gain to compensate for variation of said instantaneous gain and to generate a constant transfer function between the control output signal and the amplified control output signal;

generating a processed signal based on said input signal; and generating said control output signal by scaling said processed signal with the generated control gain.

30. The method according to claim 18, wherein the generating a control output signal comprises:

generating a value of the instantaneous electric input power supplied to said transducer based on the control output signal or sensed information of the state of the transducer;

updating a resistance parameter describing the time varying dc-resistance at the electric terminals of said transducer based on the sensed state of the transducer to consider the influence of varying ambient condition;

estimating a predicted value of the time variant dc-resistance by using the instantaneous electric input power and the resistance parameter in the parameter vector;

comparing said predicted value with a predefined limit value and generating a control signal which indicates an anticipated thermal overloading of said transducer;

generating the control output signal from said control input signal by using said control signal to reduce the amplitude of the control output signal in time and to prevent a thermal overloading.

31. The method according to claim 30, wherein the generating a control output signal comprises:

generating an instantaneous value by integrating the predicted value with a time constant corresponding to the thermal time constant of said transducer;

generating a predefined transfer behavior between the input signal and the output signal of said transducer by compensating the temporal variation of said instantaneous dc-resistance.

32. The method according to claim 18, wherein the generating a control output signal comprises:

estimating a predicted peak value of the position of the mechanical vibration element of the transducer based on the parameter vector and the time variant property vector;

generating a control signal by comparing said predicted peak value with a permissible limit value which anticipates a mechanical overloading of said transducer; and attenuating low frequency components in the control input signal by using said control signal in order to prevent said mechanical overloading and in order to keep the position of the mechanical vibration element of the transducer below said permissible limit value.

33. The method according to claim 32, wherein the estimating an predicted peak value comprises:

generating a characteristic in the time variant property vector which describes said instantaneous offset of the mechanical vibration element of the transducer;

generating the instantaneous position information of the mechanical vibration element of the transducer by using the input signal, the parameter vector and the time variant property vector;

generating velocity information of the mechanical vibration element of the transducer and a higher-order derivative information of the position information;

segmenting the movement of said mechanical vibration element into multiple phases, wherein at least one phase of the multiple phases describes the acceleration of the mechanical vibration element and at least one further phase of the multiple phases describes the deceleration of the mechanical vibration element; and estimating the predicted peak value by using a nonlinear model considering the properties of each phase.

* * * * *